(12) United States Patent
Liebmann et al.

(10) Patent No.: US 7,470,489 B2
(45) Date of Patent: Dec. 30, 2008

(54) METHOD FOR DESIGNING ALTERNATING PHASE SHIFT MASKS

(75) Inventors: Lars W Liebmann, Poughquag, NY (US); Carlos A Fonseca, Staten Island, NY (US)

(73) Assignee: International Business Machines Corporation, Armonk, NY (US)

( * ) Notice: Subject to any disclaimer, the term of this patent is extended or adjusted under 35 U.S.C. 154(b) by 758 days.

(21) Appl. No.: 10/920,786

(22) Filed: Aug. 18, 2004

(65) Prior Publication Data

US 2006/0040188 A1 Feb. 23, 2006

(51) Int. Cl.
*G03F 1/00* (2006.01)
*G06F 17/50* (2006.01)
(52) U.S. Cl. ............................................. 430/5; 716/21
(58) Field of Classification Search ............... 430/5, 430/394; 716/19–21
See application file for complete search history.

(56) References Cited

U.S. PATENT DOCUMENTS

| | | | |
|---|---|---|---|
| 5,923,566 | A | 7/1999 | Galan et al. |
| 6,277,527 | B1 | 8/2001 | O'Grady et al. |
| 6,338,922 | B1 | 1/2002 | Liebmann et al. |
| 6,609,245 | B2 | 8/2003 | Liebmann et al. |
| 2003/0093766 | A1 | 5/2003 | Liebmann et al. |
| 2003/0101430 | A1 | 5/2003 | Liebmann et al. |
| 2005/0287444 | A1* | 12/2005 | Graur et al. ................... 430/5 |

OTHER PUBLICATIONS

U.S. Appl. No. 10/707,962, filed Jan. 28, 2004, Liebmann et al.
"Exposing the DUV SCAAM—75nm Imaging on the Cheap!"; Marc d. Levenson and Takeaki (Joe) Ebihara; M.D. Levenson Consulting, Saratoga, CA 95070; Proceedings of the SPIE vol. 4692; 2002; pp. 288-297, Jun. 2002.
"Lithography, resolution enhancement, Design for Manufacturability"; Lars Liebmann; IBM Microelectronics, Semiconductor Research and Development Center; Coauthored with Greg Northrop; James Culp; Leon Sigal; Arnold Barish; Carlos Fonseca and Juan-Antonio Carballo; 13 pages, Jun. 2002.

* cited by examiner

*Primary Examiner*—Stephen Rosasco
(74) *Attorney, Agent, or Firm*—DeLio & Peterson, LLC; Kelly M. Nowak; Todd M. C. Li

(57) ABSTRACT

A method of designing an alternating phase shifting mask for projecting an image of an integrated circuit design having a plurality of spaced segments of critical dimension. The method initially identifies a phase universe boundary, such that the phase universe comprises a contiguous region of the integrated circuit layout wherein critical dimension segments within the phase universe are beyond a maximum phase interaction distance from any critical dimension segments outside the phase universe in accordance with predetermined design rules. The method then divides the phase universe into phase regions separated by the integrated circuit layout and any extensions of the critical dimension segments so that the phase regions are binary colorable within the phase universe.

31 Claims, 19 Drawing Sheets

METHOD FOR DESIGNING ALTERNATING PHASE SHIFT MASKS

BACKGROUND OF THE INVENTION

1. Field of the Invention

The present invention is directed to the manufacture of masks used in the lithographic production of integrated circuits and, in particular, to the manufacture of phase shifting masks (PSMs).

2. Description of Related Art

As an alternative to chrome on glass (COG) masks used in the lithographic production of integrated circuits, alternating phase shifting masks (altPSMs) have been employed in order to increase the resolution of the critical active area patterns projected. Such increased resolution enables smaller line widths to be exposed on the resist and consequently etched into or deposited on the wafer substrate. The critical dimension (CD) of the system is the smallest dimension that the lithographic system can create on the resist layer by normal techniques, and altPSMs permit sub-CD widths to be exposed and created on the wafer. This is done by manipulating the electric field vector or phase of the energy beam, e.g., visible or ultraviolet light, used in the lithographic process. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude, but point in exactly the opposite direction, so that any interaction between these light beams results in perfect cancellation. However, since the recessed regions on the mask have to form closed polygons and not all edges of these polygons can be made to coincide with desired layout images, the light intensity decrease caused by these residual 180° phase steps leads to unwanted patterns on the wafer. These unwanted residual phase images are erased using a second exposure, commonly using a non-phase shifted trim or block mask.

One of the major challenges in generating an altPSM layout is to create manufacturable and lithographically viable phase shapes without introducing undue layout conflicts. Traditional phase shift design approaches start the design process by generating phase regions around critical segments of the design and then remove manufacturability violations by expanding narrow phase regions and filling narrow phase spaces. Since every expansion can lead to new spacing violations and every fill operation can lead to new width violations, phase shape legalization has to be done iteratively.

A typical prior art iterative legalization/cleanup method for creating an altPSM mask design is shown in FIGS. 1-3. The goals of the prior art iterative legalization/cleanup are to remove all lithographic and manufacturability constraint violations, avoid phase assignment conflicts and keep the phase shapes as simple as possible. In a typical legalization methodology, if a spacing violation occurs, the cleanup step will modify the phase edge segment in violation by an incremental amount that is a fraction of the minimum width ($W_{min}$) allowed by manufacturability constraints, e.g. ¼ of $W_{min}$.

In FIG. 1, a desired layout 300 of circuit features 302, 304, 306 requires phase shifting shapes 312, 314, 316 to project portions of the features. In order to complete the design of the phase shifting shapes, the prior art iterative method identifies a region shown by arrow 320 that violates the minimum width rule dictated by mask manufacturability incrementally adds. To correct the rule violation, the prior art method adds phase shape portions 312a, 314a. However, since these portions still violate the minimum width rule vertically, and now also add a further minimum width violation horizontally, additional expansion is made by adding portions both below and to the side in several steps. The additional expansion is shown in FIG. 2, where further vertical and horizontal additions are shown as 312b, 312c, 314b and 314c. The horizontal expansion of phase shifting shape 314 has now resulted in an additional violation of the minimum space rule between the phase shifting shape and the adjacent feature 304, as shown by arrow 322. As shown in FIG. 3, additional iterations add horizontal extensions, e.g., portion 314d, and eventually correct the space violation as well as the minimum width violations.

For this particular example, six iterations are required to converge on a stable solution. In other cases, more iterations may be required, and some cases, there may be no convergence. This iterative cleanup is time consuming and error prone. It is impossible to predict the exact number of iterations required, and most CAD tools do not support looping.

One alternate prior art design approach is to design phase transitions rather than designing phase shapes. This was attempted previously in router based altPSM deisgns However, router-based altPSM designs have the disadvantage that they do not carry a preferred orientation of the phase transitions through the entire layout segment, and instead force closed loops. This detracts from good lithographic performance.

Therefore, there is a need to generate altPSM shapes that meet manufacturability and lithography requirements without lengthy and error prone iterative cleanup in small steps, while minimizing shape complexity and avoiding topological phase errors caused by overly aggressive phase shape cleanup. It would also be preferable to create layouts in which the primary or dominant orientation of the features are in the same direction to improve lithographic performance.

SUMMARY OF THE INVENTION

Bearing in mind the problems and deficiencies of the prior art, it is therefore an object of the present invention to provide an improved method for designing phase shifting masks for lithographic production of integrated circuits, particularly altPSMs.

It is another object of the present invention to provide a method of designing altPSMs that eliminates phase width or spacing violations.

A further object of the invention is to provide a method of designing altPSMs that eliminates lengthy and error prone iterative cleanup in small steps, while minimizing shape complexity and avoiding topological phase errors caused by overly aggressive phase shape cleanup.

Still other objects and advantages of the invention will in part be obvious and will in part be apparent from the specification.

The above and other objects, which will be apparent to those skilled in art, are achieved in the present invention which is directed to a method of designing an alternating phase shifting mask for projecting an image of an integrated circuit design. The method initially provides a design of an integrated circuit layout having a plurality of spaced segments of critical dimension, and then identifies a phase universe boundary. The phase universe comprises a contiguous region of the integrated circuit layout wherein critical dimension segments within the phase universe are beyond a maximum phase interaction distance from any critical dimension segments outside the phase universe in accordance with predetermined design rules. The method then divides the phase universe into phase regions separated by the integrated circuit layout and any extensions of the critical dimension segments so that the phase regions are binary colorable within the phase universe.

The method may then further include assigning phases to the phase regions and creating an alternating phase shifting mask design based on the phases assigned to the phase regions. Preferably, the method also includes forming extensions of the critical dimension segments along extensions of axes thereof, wherein the extensions of the critical dimension segments having widths of at least a minimum spacing between phase regions. At least some of the extensions of the critical dimension segments may terminate at the phase universe boundary.

Forbidden regions may be defined by applying lithographic and manufacturability phase shift design rules and constraints around the critical segments. The method may further include defining a critical axis along a length of each of the critical dimension segments, routing the critical axes to avoid forbidden regions, and forming extensions of the critical dimension segments along the routed critical axes.

The regions outside the phase regions adjacent to the critical dimension segments are defined as layout freespace, and the method may further include selectively removing or merging portions of extended critical dimension segment axes within the layout freespace prior to dividing the phase universe. Typically, the phase universe boundary is substantially rectangular.

In another aspect, the present invention is directed to a method of designing an alternating phase shifting mask for projecting an image of an integrated circuit design comprising initially providing a design of an integrated circuit layout having a plurality of segments of critical dimension, each critical dimension segment having an axis, extending the critical dimension segment axes beyond the critical dimension segments, and identifying regions adjacent to the critical dimension segments to be occupied by phase shifting shapes of opposite phase to project the segments. Regions outside the identified regions adjacent to the critical dimension segments are defined as layout freespace, and the method includes selectively removing or merging portions of the extended critical dimension segment axes within the layout freespace. The method then includes identifying major phase shifting regions outside of the integrated circuit layout and remaining extended critical dimension segment axes within the layout freespace, assigning phases to the identified major phase shifting regions and creating an alternating phase shifting mask design based on the phases assigned to the identified major phase shifting regions.

The method may further include creating a boundary around the integrated circuit layout, such that the layout freespace comprises regions outside the identified regions adjacent to the critical dimension segments and within the layout boundary, and may further include extending the critical dimension segment axes to the layout boundary.

The design of the integrated circuit layout may further include a plurality of segments of non-critical dimension, such that the layout freespace excludes space between segments of non-critical dimension that has a width less than a predetermined minimum phase shape width.

The method may also include selectively removing portions of the extended critical dimension segment axes within the layout freespace between the layout boundary and the regions adjacent to the critical dimension segments to be occupied by phase shifting shapes.

The method may further include identifying portions of pairs of the extended critical dimension segment axes essentially parallel to each other and spaced within a predetermined minimum phase shape width. In such case, the method may include replacing the pairs of the extended critical dimension segment axes with a single extended critical dimension segment axis intermediate the pair, or joining the pairs of the extended critical dimension segment axes with an extended critical dimension segment axis perpendicular to the pair.

The method may include identifying portions of the extended critical dimension segment axes that intersect at a point between the layout boundary and either the critical dimension segments or the regions adjacent to the critical dimension segments to be occupied by phase shifting shapes, and removing such portions between the intersection point and the layout boundary. Additional axes may be added to join the extended critical dimension segment axes within the layout freespace.

The method may also include identifying portions of the extended critical dimension segment axes that intersect with a region, adjacent to a critical dimension segment perpendicular thereto, to be occupied by a phase shifting shape, terminating such portions before they intersect, adding an additional axis perpendicular to the terminated portions of the extended critical dimension segment axes, and joining the terminated portions of the extended critical dimension segment axes with the additional perpendicular axis within the layout freespace.

Phases may be assigned to the identified final phase shifting regions by assigning opposite phases to regions on opposite sides of the integrated circuit layout and remaining extended critical dimension segment axes within the layout freespace, assigning a default phase to any additional identified final phase shifting regions, and merging similar phases across any of the remaining extended critical dimension segment axes. Preferably, similar phases are not merged across any of the integrated circuit layout.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE PREFERRED EMBODIMENT(S)

In describing the preferred embodiment of the present invention, reference will be made herein to FIGS. 4-19 of the drawings in which like numerals refer to like features of the invention.

Figure 18:
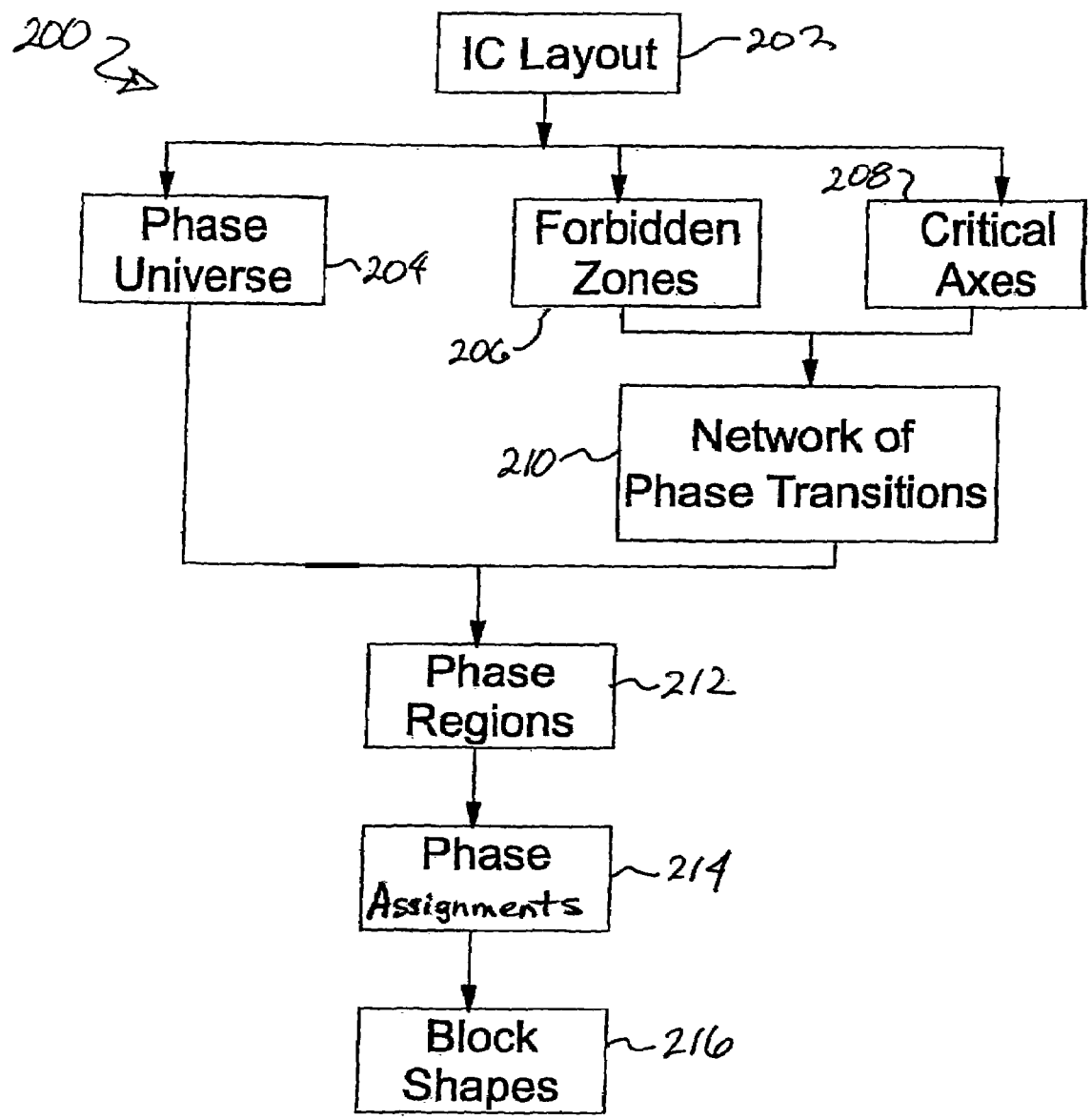
FIG. 18 is a flow chart showing the preferred steps of practicing the method of designing an altPSM of the present invention.

A method and computer system is described for designing an alternating phase shifting mask for projecting an image of an integrated circuit design. In the preferred method the design commences by organizing the initial circuit design pattern layout into discrete regions containing phase dependencies, and within each phase dependent region, dividing the region into relatively simply shaped polygons for phase shift regions that obey the lithographic and manufacturability constraints while avoiding layout conflicts. The resulting altPSM layouts have improved accuracy, efficiency, and lithographic performance compared to altPSM layouts using conventional design methodologies. FIG. 18 illustrates a flowchart of a preferred embodiment of the method 200 for designing an altPSM layout design in accordance with the present invention, and is described in more detail in the following discussion.

The inventive design approach is based on three key concepts. First, the layout of target primary design features is divided into what is termed phase universes by identifying regions within which critical design features are spaced sufficiently close that there are likely to be phase shape interactions according to lithographic and manufacturability phase shift design rules and constraints. A phase universe is defined as a region of a layout beyond which no further phase dependencies need to be taken into account. This can be the macro boundary or the enclosure of primary polygons which have been expanded by a phase dependency length, for example, a maximum phase shape width $W_{max}$.

In the second concept, zones are defined in which it is known that phase transitions will not be supported, for example, by applying the lithographic and manufacturability phase shift design rules and constraints around critical primary design features. Such a zone is referred to hereinafter as a forbidden zone. These forbidden zones may be: a) regions around critical features, approximately a phase region wide, or b) narrow spaces between critical features and the like, as defined by various lithographic and manufacturability constraints. In one embodiment, the forbidden regions vary based on the orientation of the phase transition that they block. For example, a region next to a non-critical primary structure less than a minimum phase width can be traversed by a phase transition that is perpendicular to the non-critical edge. However, a phase transition may not run parallel to the non-critical edge within a minimum phase width as this would lead to an unmanufacturable narrow phase sliver.

In the third concept, a network of phase transitions is formed within each phase universe, so that the phase transition axes or critical axes are routed to avoid the forbidden zones. The critical axis (i.e., the axis across which a phase transition will occur) of the primary shapes is preferentially extended all the way to the edge of the phase universe where possible. The phase transitions start as the critical axis of the primary features and are then extended, merged, and re-routed until they preferentially terminate at the edge of the phase universe, or form a closed loop if the critical axis cannot be easily routed around a forbidden zone. These phase transition axes divide the background areas of the phase universe into phase shape regions that are partially bordered by the target primary layout shapes. Each phase shape region is then binary colored to create a phase transition (e.g., from 0° to 180°) across all of the extended critical axes. Thus, in accordance with the present invention, the phase shift regions are designed according to allowable background areas, rather than around critical features.

Figure 1:
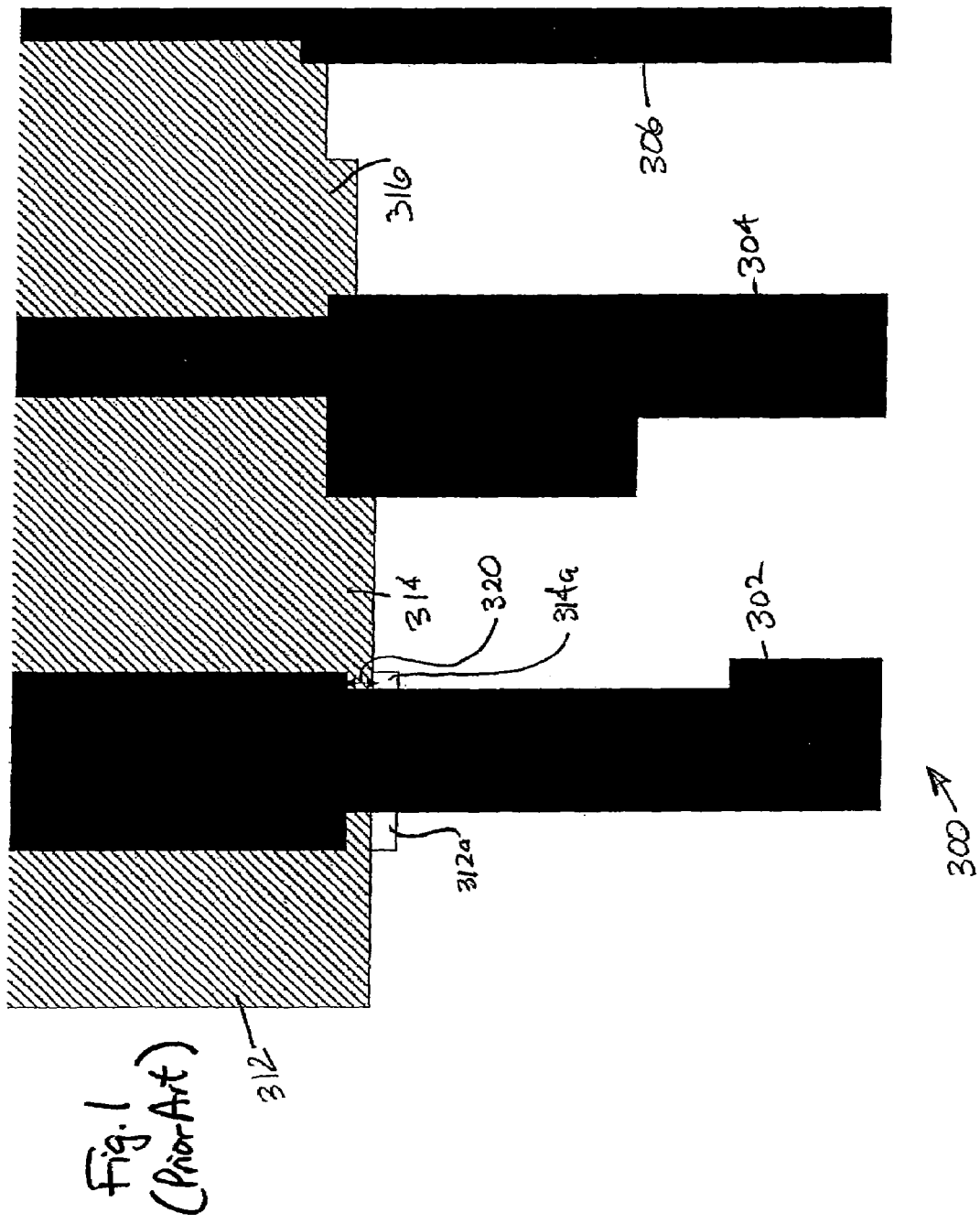
FIGS. 1-3 are top plan views illustrating the prior art iterative method of creating a phase shifting shape layout.
Figure 2:
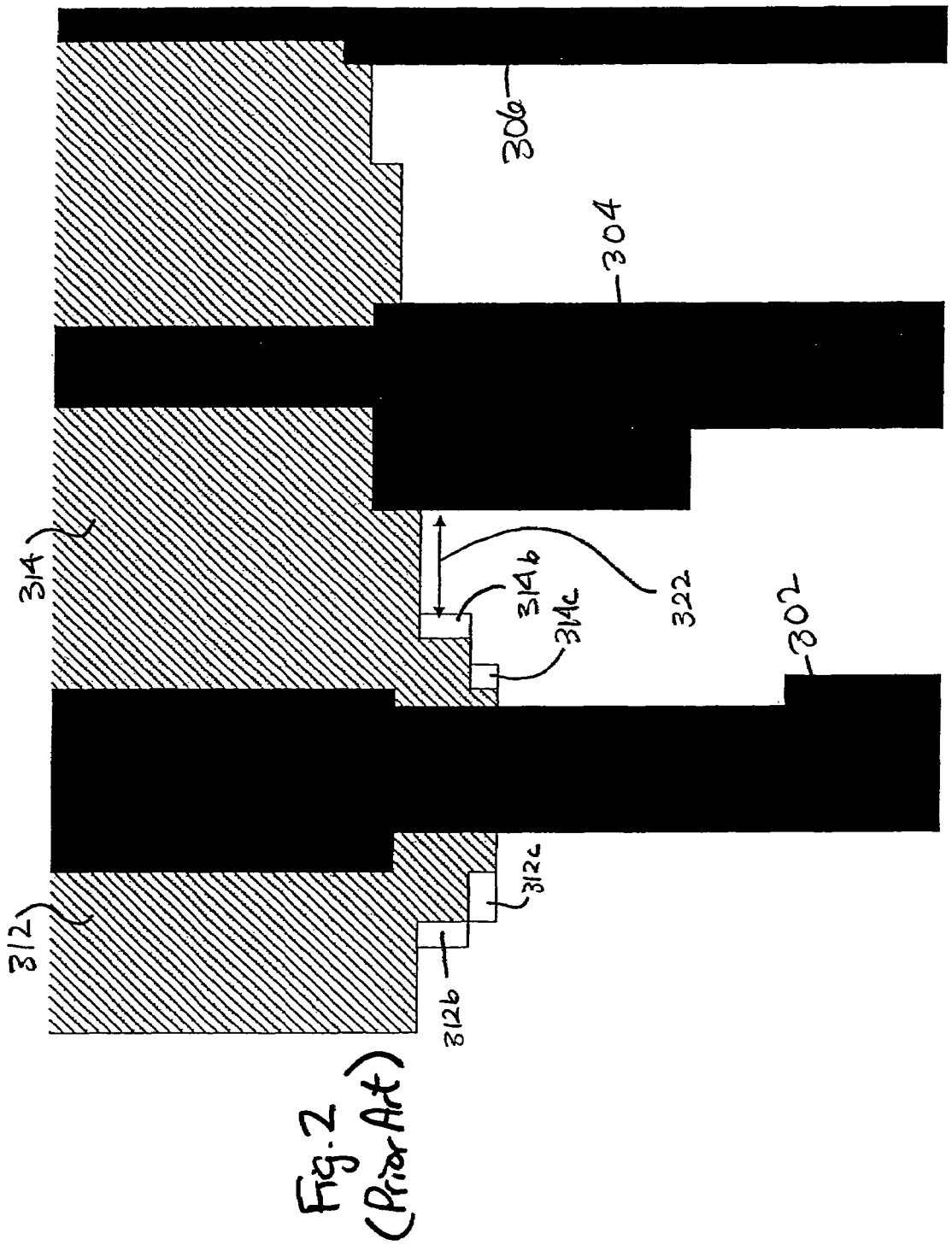
Figure 3:
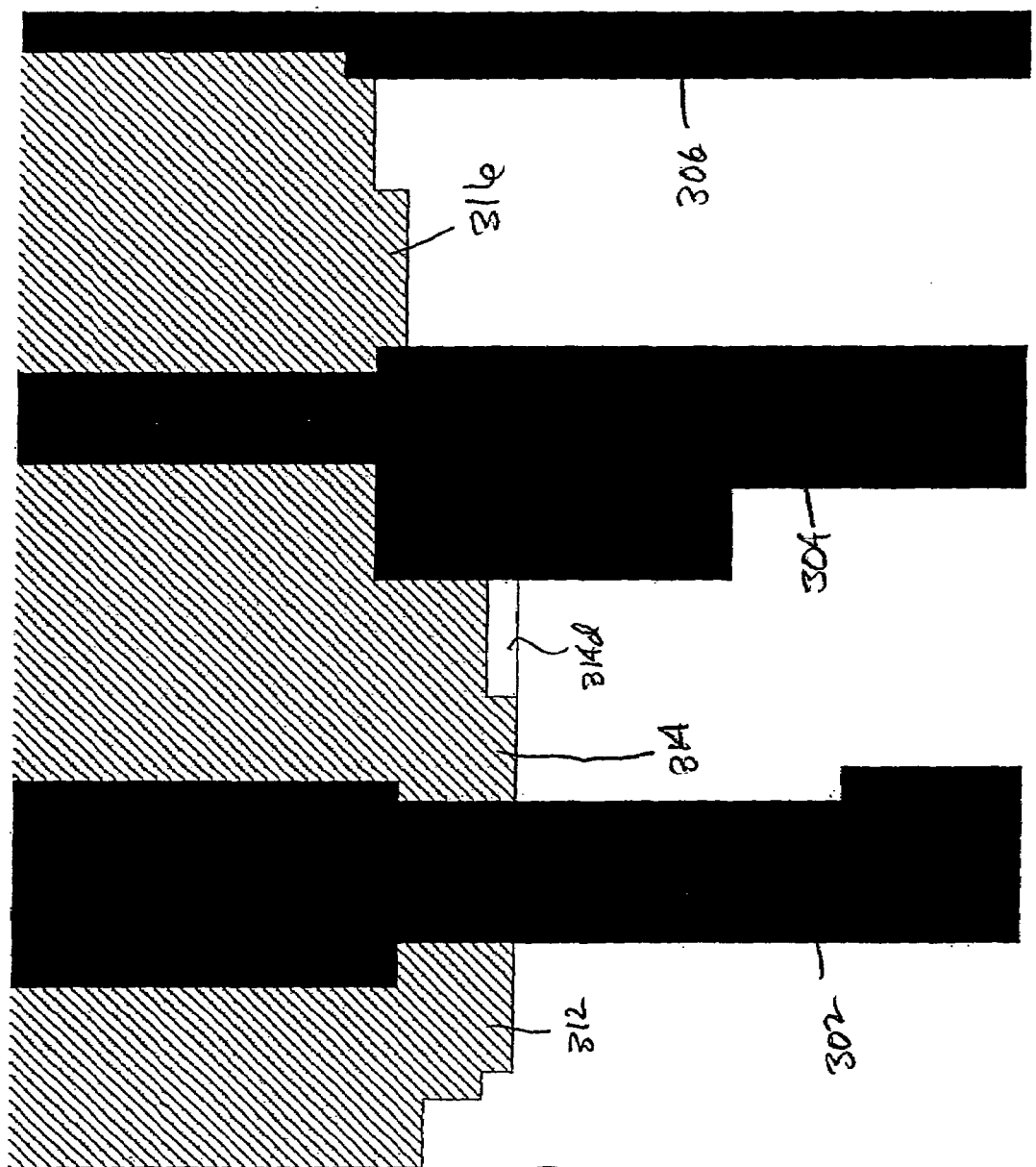
Figure 4:
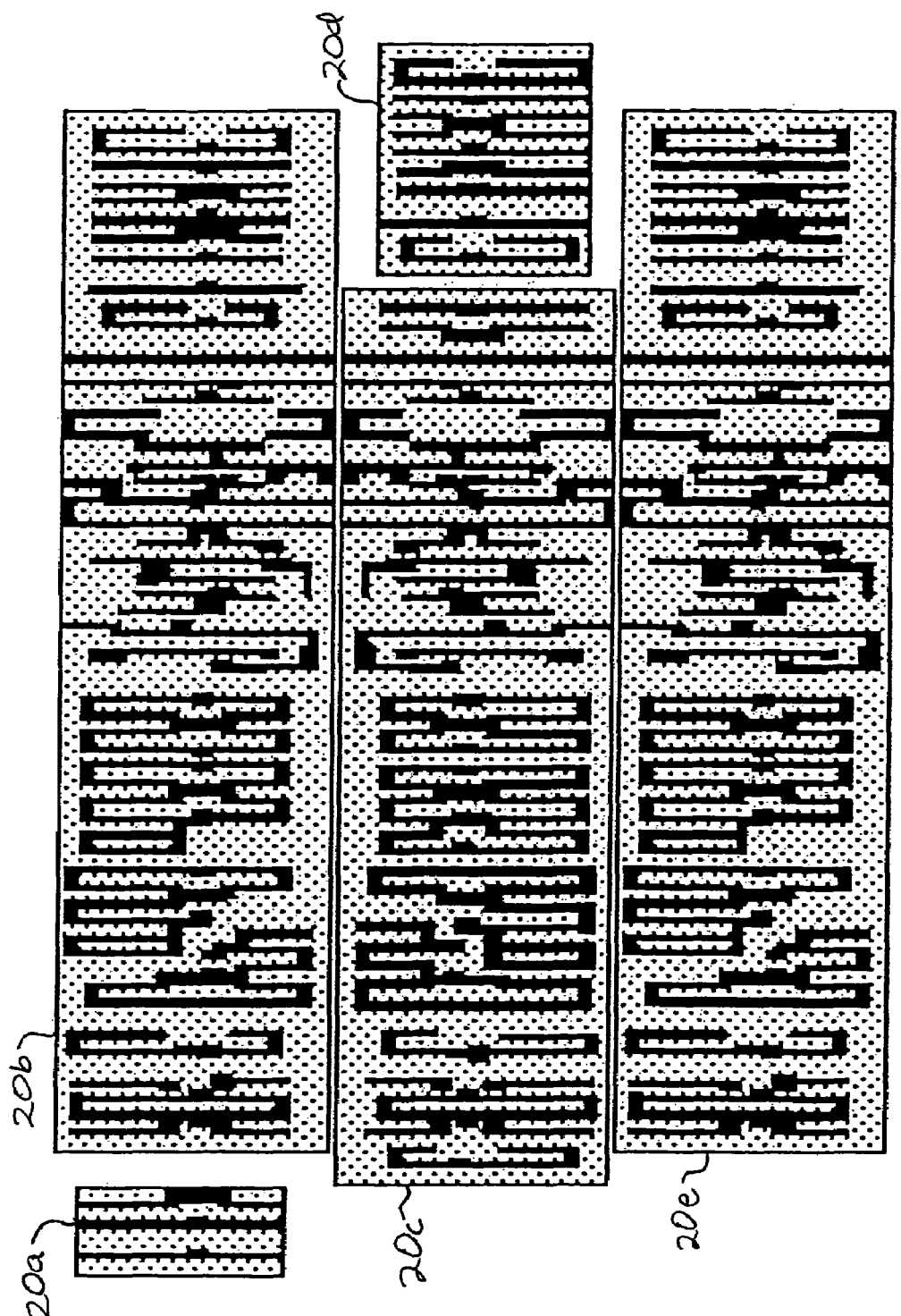
FIG. 4 is a top plan view of integrated circuit design elements divided by boundaries into a plurality of phase universes in accordance with the present invention, each with critical features and their associated phase shapes that do not interact with those of other phase universes.

Referring to FIG. 4, a given layout 100 of target patterns to be printed is provided. These target patterns may be provided by a circuit designer and are, for example, a patterned level for an integrated circuit, such as polysilicon gate conductor patterns, that correspond to the primary design shapes desired to be printed on the wafer (step 202 of FIG. 18). A maximum phase interaction distance or width $W_{max}$ between the critical dimensions of primary features where phase shapes are likely to be generated, can be identified from the predetermined altPSM lithographic and manufacturability design rules and constraints. A macroscopic area of interest, that is, the phase universe, is identified by identifying all neighboring primary target shapes having potentially phase related shapes within the maximum phase interaction distance $W_{max}$ and enclosing those primary design shapes, including a sufficient buffering background area of at least width $W_{max}$, around critical dimensions of interacting primary target shapes, within a common, largely rectangular, boundary, for example, regions 20a, 20b, 20c, 20d and 20e. The boundary of each phase universe is drawn so that critical features and their associated phase shapes outside of the boundary will not interact with the phase shapes associated with critical features inside the boundary, according to the lithographic and manufacturability design rules and constraints. The shape of each boundary is preferably rectangular, so that the resulting phase shift polygons will be as simply shaped as possible. Phase-legal topologies are ensured by eliminating any phase transition terminations inside the defined phase universe, i.e., by extending and merging the centerlines of all critical segments until no isolated centerline axis terminates inside the phase universe. This then ensures that a phase-colorable layout solution exists.

Figure 5:
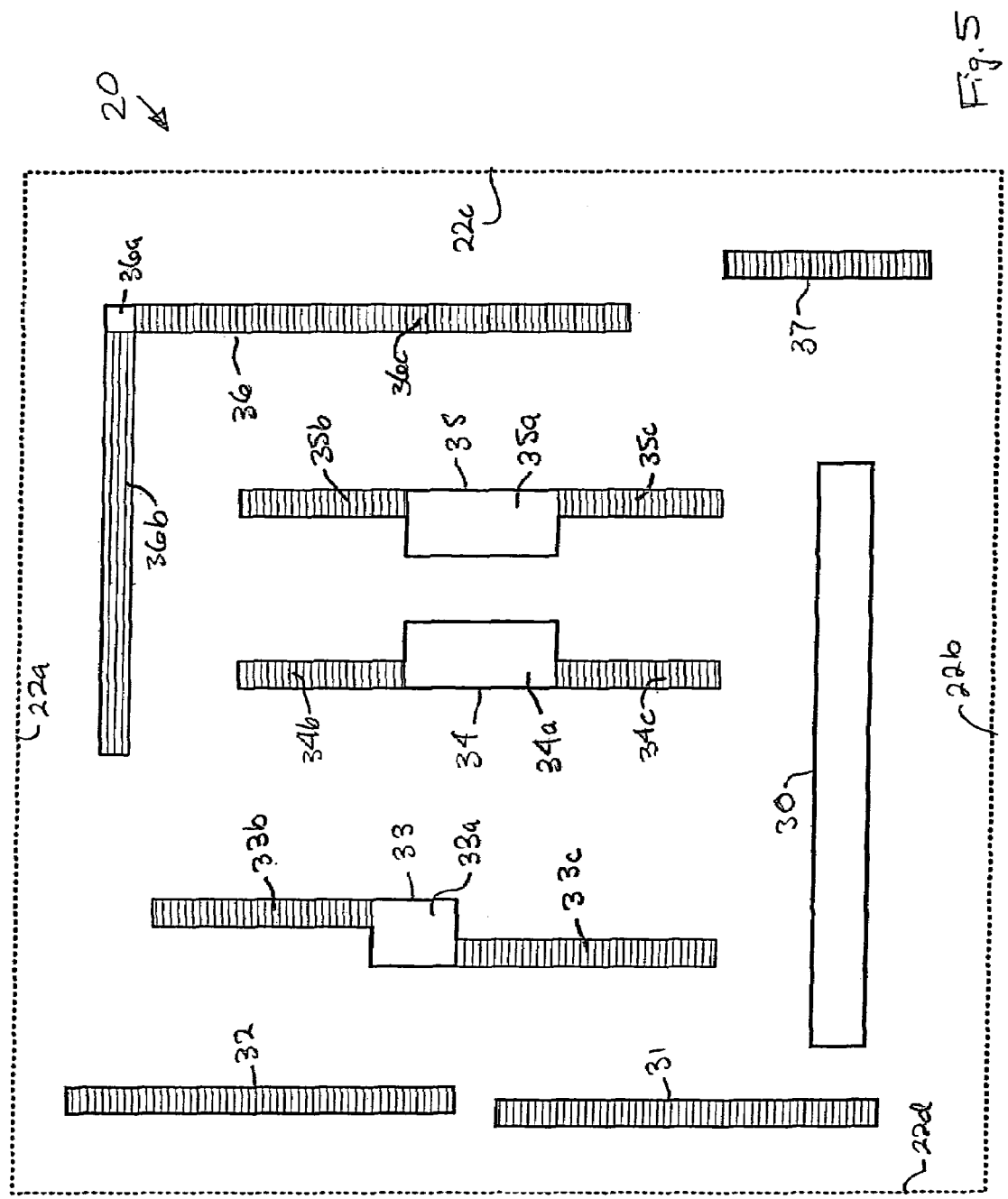
FIG. 5 is a plan view of the critical and non-critical width integrated circuit design segments within a single phase universe for which an alternating phase shifting mask (altPSM) is to be fabricated.

A more detailed view of an exemplary phase universe is illustrated in FIG. 5. The method of the present invention defines the phase universe 20 (step 204 of FIG. 18) by creating boundaries 22a, 22b, 2c and 22d that enclose a plurality of primary circuit feature (target) shapes 31-37. Primary feature or target 30 has feature dimensions which are greater or equal to a cutoff value or dimension; dimensions smaller than this cutoff value are referred to hereinafter as the critical dimension (CD). Other primary features or targets 31, 32 and 37 have a width dimension which is less than the cutoff dimension. Yet other primary features or targets have critical width segments or CD portions, i.e., segments, or portions of the target or feature that have a width dimension less than the cutoff dimension. These include target 33, which has CD portions 33b and 33c, and non-CD portion 33a, target 34, which has CD portions 34b and 34c, and non-CD portion 34a, target 35, which has CD portions 35b and 35c, and non-CD portion 35a, and target 36, which has CD portions 36b and 36c, and non-CD portion 36a. The CD portions of the targets are generally shown by horizontal shading lines. The target portions extending vertically in FIG. 5 are essentially parallel to one another, and the target portions extending horizontally are essentially parallel to one another and transverse or perpendicular to the vertical portions.

Next, in accordance with the invention, the phase universe is divided into phase regions separated by the integrated circuit layout and any extensions of the critical dimension segments so that the phase regions are binary colorable within the phase universe. The background areas, i.e., the areas outside of the integrated circuit primary features, of the phase universe are segmented into colorable phase shapes that are extended in a substantially common orientation to the boundary of the phase universe, and so that the phase shapes have a minimum of edges and vertices. In a preferred embodiment, the step of segmenting the phase universe is divided into several stages, as described below.

Figure 6:
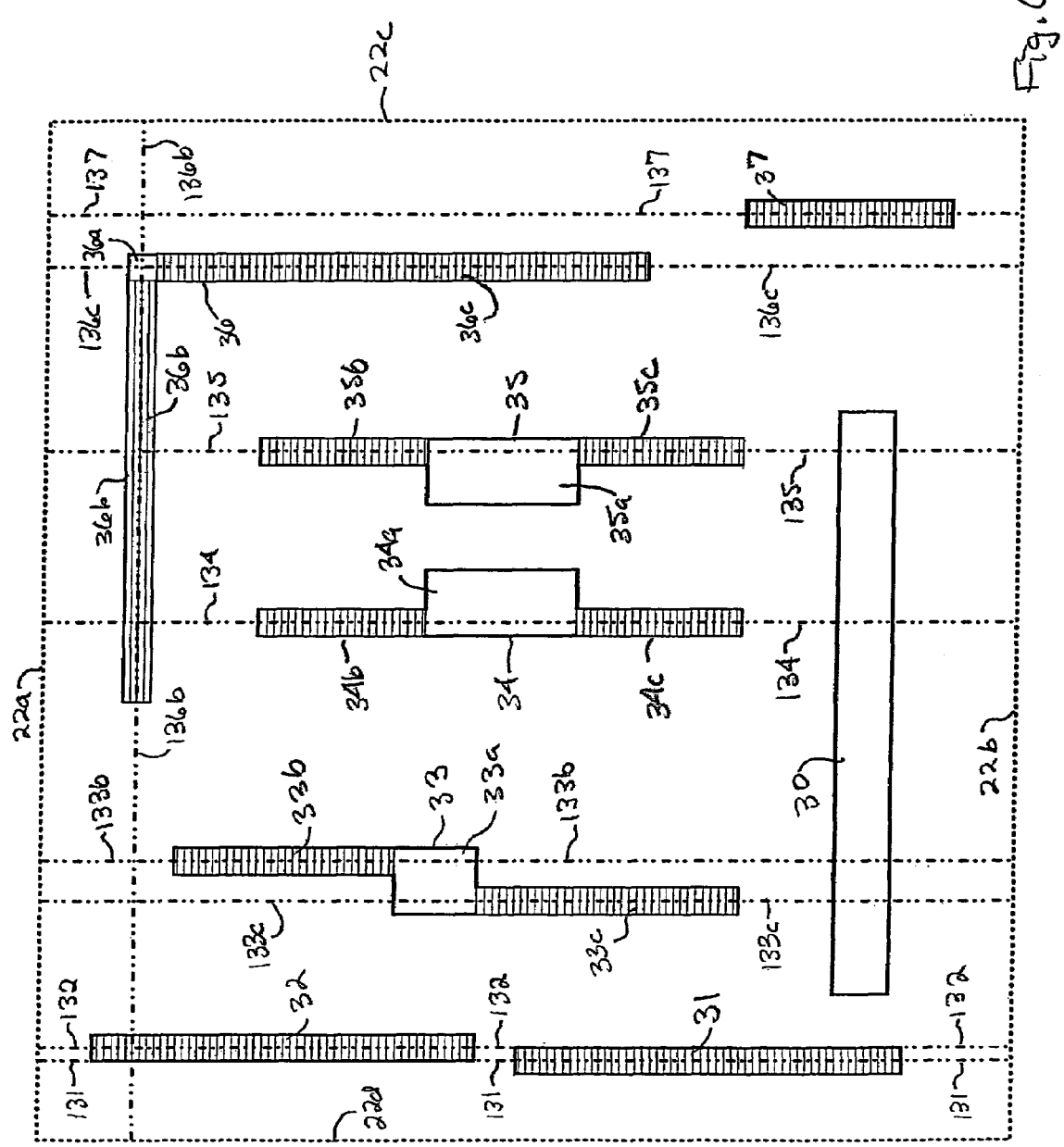
FIG. 6 is a plan view showing the extension of the axes of the critical width features in the integrated circuit design of FIG. 5, in accordance with the present invention.

First, a critical axis is identified for each critical dimension of the primary features within the phase universe (step 208 of FIG. 18). A critical axis of a primary feature is the axis that bisects the critical dimension of the feature for which phase shift shapes are to be disposed on opposing sides, i.e. the primary shape axis requiring a phase transition. The critical axes for the critical features of the exemplary phase universe 20 are illustrated in FIG. 6, and are identified with the numeral 1 before the critical width feature or portion to which it belongs. For example, critical feature 32 has critical axis 132 extending vertically above and below the feature, while critical portion 36b has critical axis 136b extending to the right and left of the feature. Critical axes are not defined for non-critical primary features or portions thereof. Since a primary feature may have a plurality of critical features that are not coaxial, there may be more than one critical axis within a given primary feature, for example, critical axes 133b and 133c of feature 33. In a preferred embodiment, these critical axes are used as the basis for creating a network of phase transition axes for segmenting the phase universe into phase shape polygons, as described more fully below.

Before creating the network of phase transition axes, forbidden zones are defined (step 206 of FIG. 18). The forbidden zones are regions through which phase transition axes cannot traverse. One type of forbidden region or space is that which is occupied by the critical features or portions themselves. Moreover, in accordance with lithography constraints, there must be a minimum phase shape width $W_{min}$, around the critical dimensions of a primary feature. Thus, another type of forbidden region or space is the area occupied by the phase shapes that must be used to create the critical features or portions. As another example, according to manufacturability constraints, the space between two primary feature edges must exceed a minimum distance in order to support a phase transition. Stated another way, since each phase transition axis will be assigned a phase shift polygon on either side of the phase transition, the existing space must exceed about two times the minimum phase width $W_{min}$. Therefore, yet another type of forbidden region or space is that between two critical features that is less than two times $W_{min}$.

Figure 7:
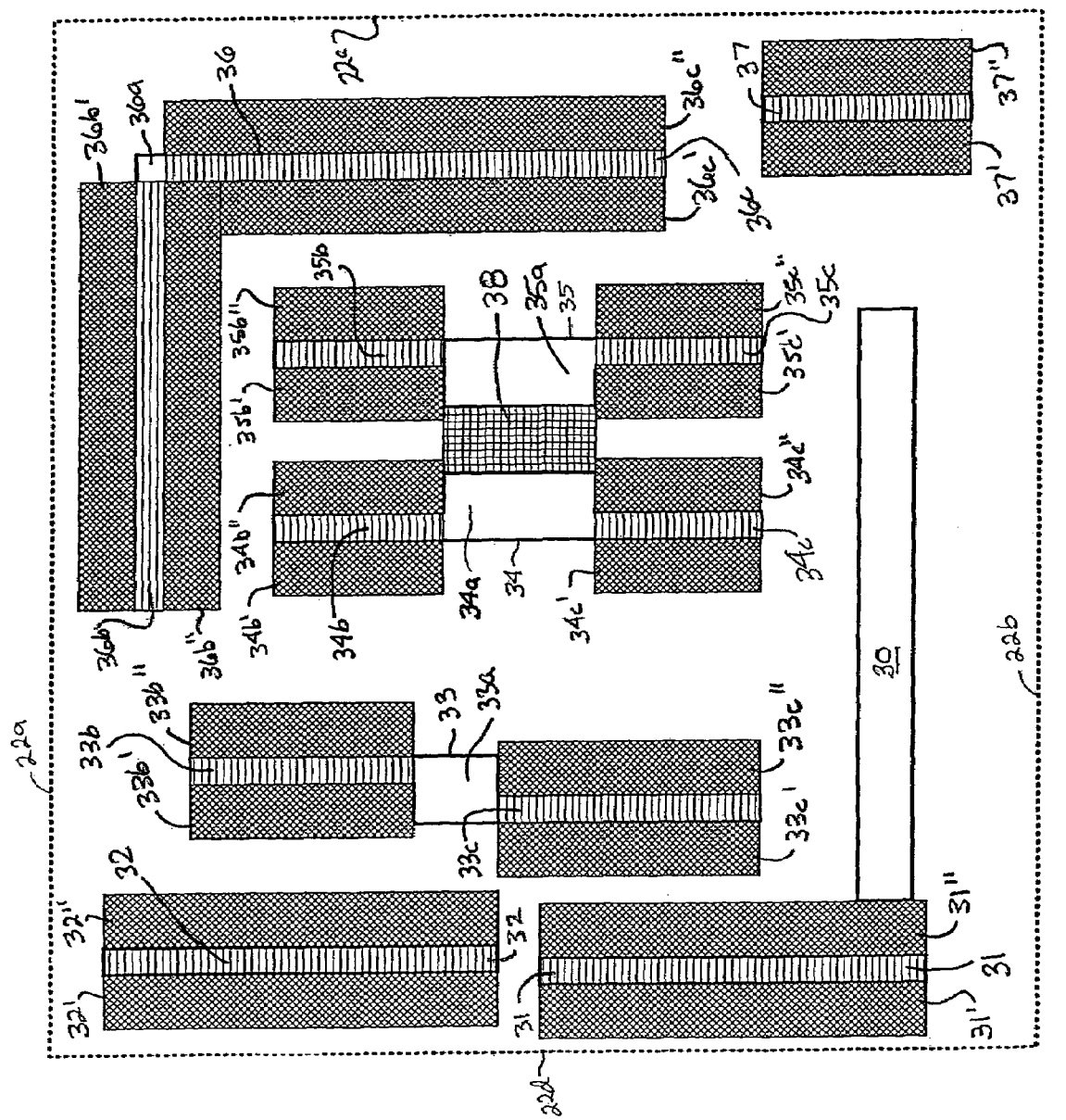
FIG. 7 is a plan view showing the identification of forbidden zones within the phase universe boundaries of the integrated circuit design of FIG. 5, in accordance with the present invention.

The forbidden zones for the exemplary phase universe 20 are illustrated in FIG. 7, wherein the phase shift shapes required to make each critical feature or portion is identified by adding a prime (') or double prime (") after the critical width feature or portion to which they belong. For example, phase shift shapes 34c' and 34c" create critical portion 34c, and phase shift shapes 37' and 37" create critical feature 37. As is well known, the phase shifting shapes on either side of a critical feature should be of opposite phase, i.e., have a 180° phase differential. In addition to the critical features and the phase shapes therefore, the forbidden zones also includes region 38, which is between non-critical portions 34a and 35a, and which is less than two times $W_{min}$.

The background regions in FIG. 7 outside of the forbidden zones and within the phase universe boundaries are referred to as freespace. Freespace is defined as the space within the layout that can support a phase transition. In general, freespace comprises all regions that are not blocked by areas such as regions parallel to critical dimension shapes that fall within the lithographically desired phase width, or regions parallel to non-critical shapes that fall within the minimum manufacturable phase transition width (i.e. less than about two times $W_{min}$).

Figure 8:
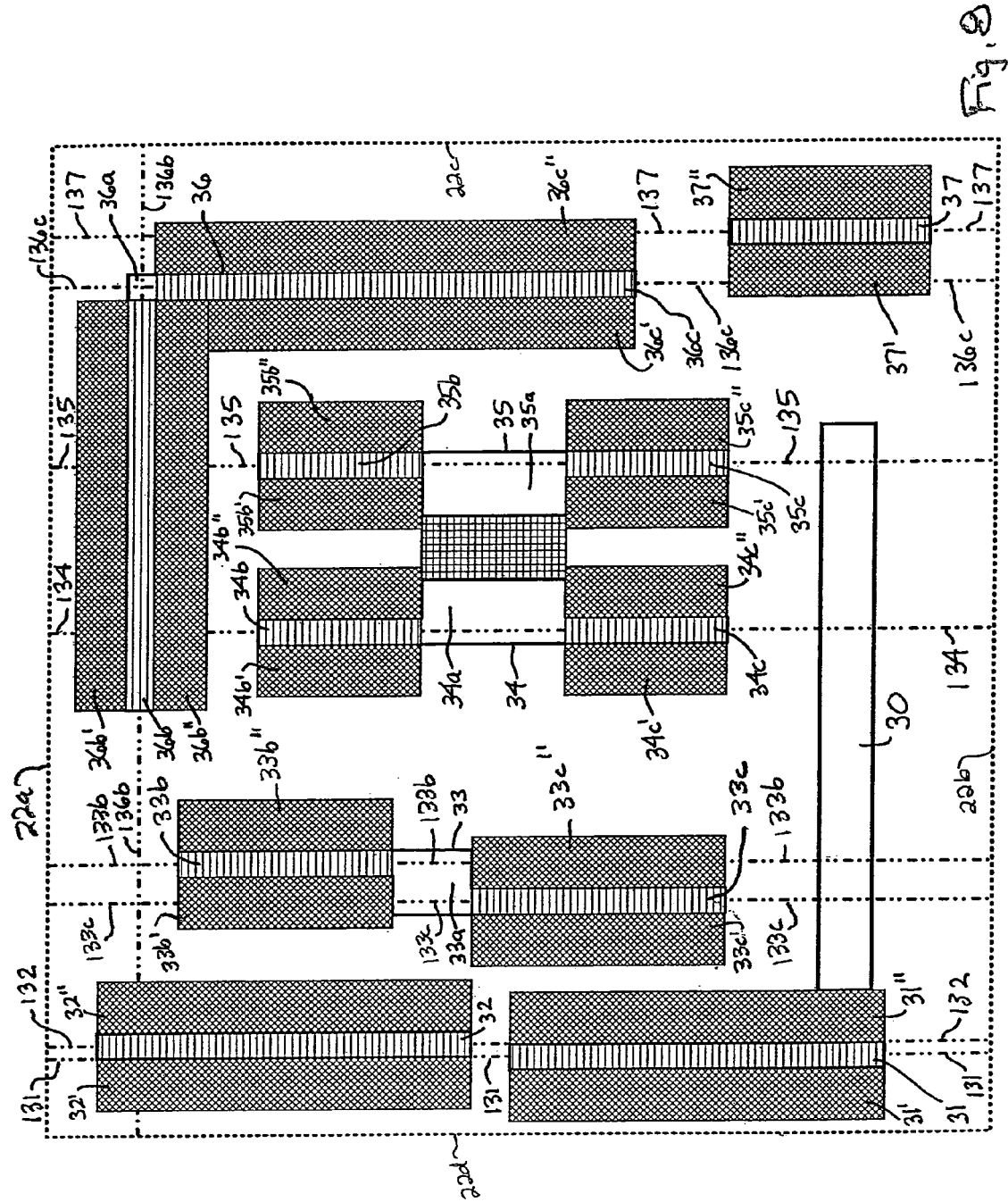
FIG. 8 is a plan view showing the superposition of the critical axes of FIG. 6 over the forbidden zones of FIG. 7, in accordance with the present invention.

In a preferred embodiment as illustrated in FIG. 8, the critical axis of each primary feature or target is then superimposed over the forbidden zones and extended to the edge of the phase universe or to the outer boundary of the forbidden zones, or, alternatively, to the edge of its freespace. The goal is to segment the phase universe into relatively simple phase shape polygons, and the extended critical axes act as a convenient basis for forming a suitable network of phase transitions to achieve such a segmentation (step 210 of FIG. 18). As described further below, a phase-colorable layout solution is created by ultimately eliminating any phase transition terminations inside the defined phase universe by extending and merging the centerlines of all critical segments until no isolated centerline axis terminates at boundary 22a.

Figure 9:
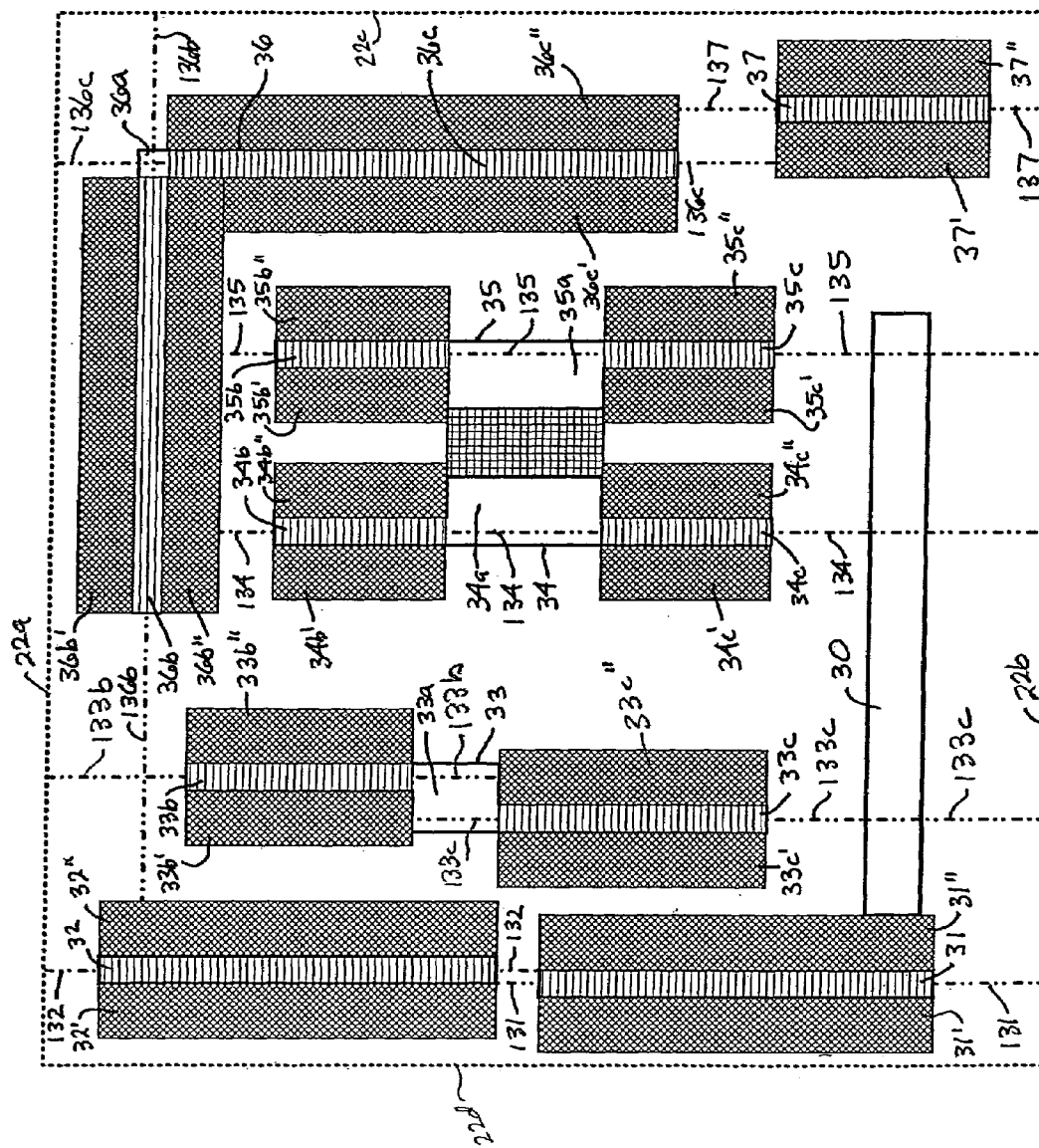
FIG. 9 is a plan view showing the elimination of dead ends of the critical axes of FIG. 8 within the phase universe boundaries of the integrated circuit design of FIG. 5.
Figure 10:
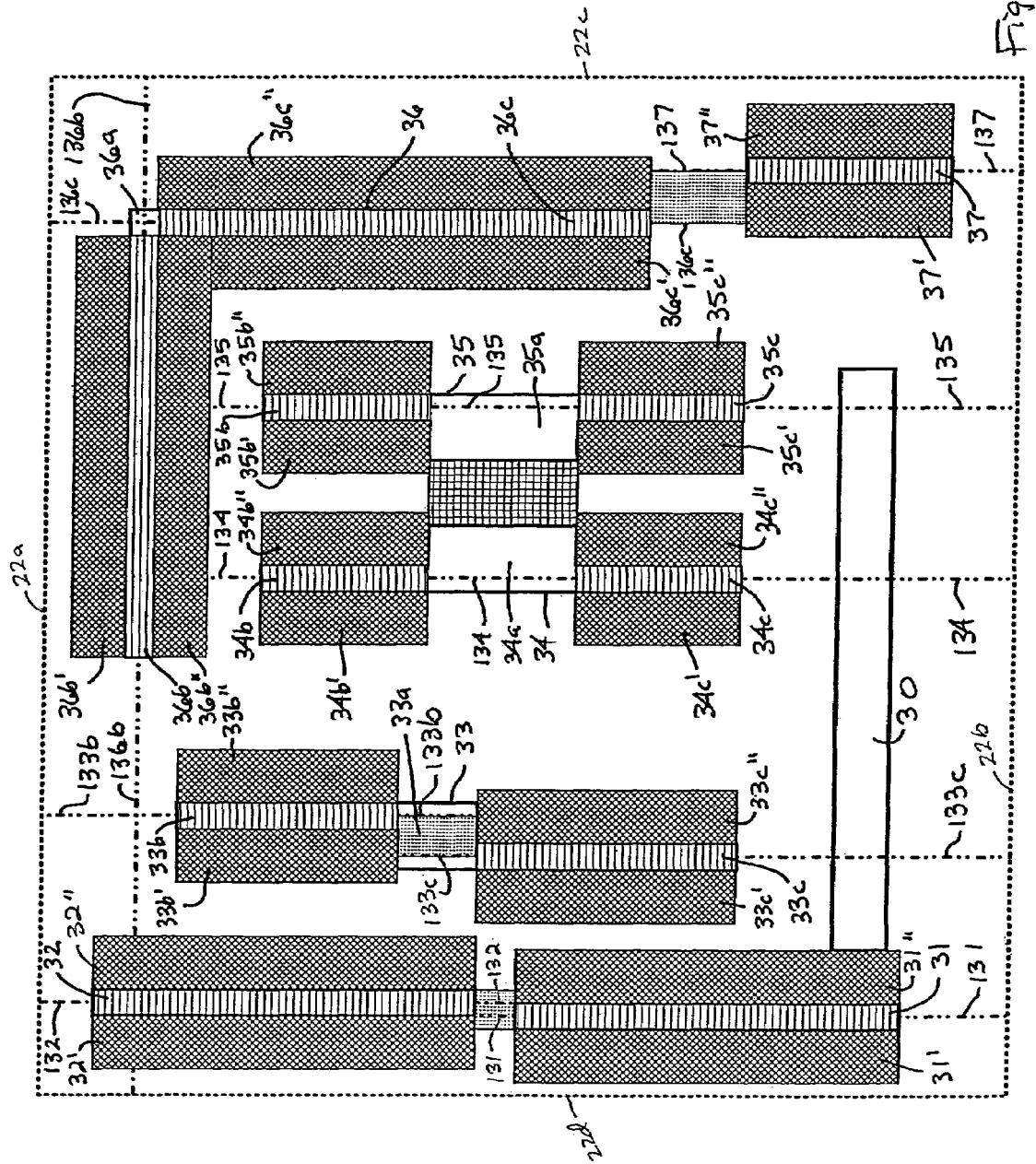
FIG. 10 is a plan view showing the identification of close critical axes of FIG. 8 within the phase universe boundaries of the integrated circuit design of FIG. 5.

The preferred next step of the invention is to eliminate congestion and simplify the routing of the phase transition axes. Initially, as shown in FIG. 9, the dead ends of extended critical axes which are not associated with a critical region are eliminated. For example, in FIG. 8, critical portion 33c has critical axis 133c extending upward to and beyond the phase shift forbidden region 33b' to boundary 22a. The portion of critical axis 133c above phase shift region 33b' which does not contact critical feature 33c is eliminated, leaving only the portion of critical axis between critical feature 33c and phase shift region 33b'. The portion of critical axis 133c below critical feature 33c, extending to boundary 22a, still remains because it is associated, or contiguous, with critical feature 33c. Likewise, the portion of critical axis 133b that extends below phase shift region 33c" is eliminated since it is not associated or contiguous with critical feature 33b, leaving only the lower portion between critical feature 33b and phase shift region 33c", and the upper portion between critical feature 33b and boundary 22a. Elimination of all other extended critical axes portions not associated or contiguous with their respective critical features is also performed, leaving only the extended critical axis portions shown in FIG. 9.

Figure 11:
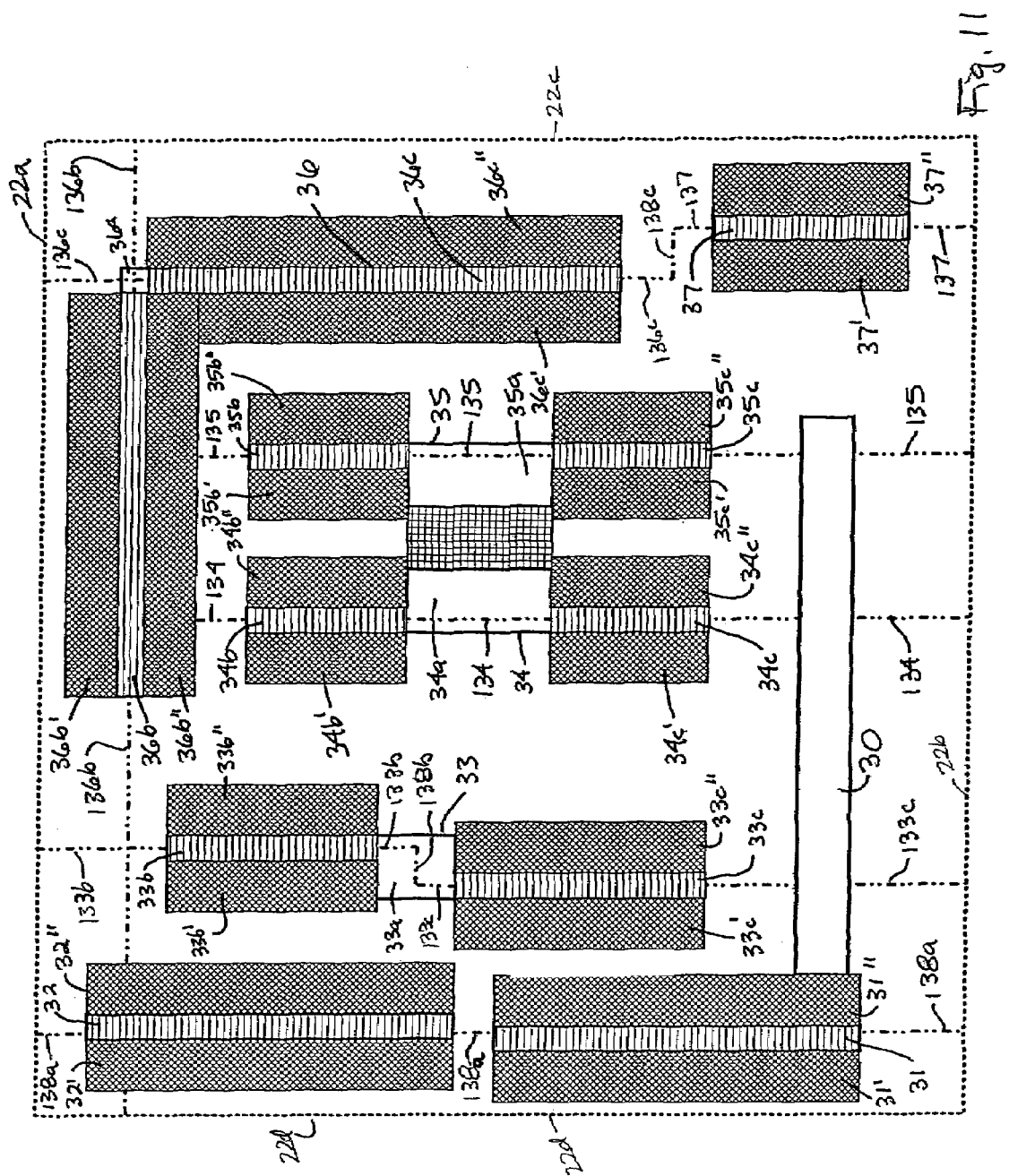
FIG. 11 is a plan view showing the merging of close critical axes identified in FIG. 10.

To further eliminate congestion of extended critical axes, crowded axis extensions, i.e., those extended axes that are parallel but in close proximity to each other, are merged into one common axis. Close proximity may be defined, for example, as an orthogonal distance less than the minimum phase shape width $W_{min}$. Parallel axes in close proximity may be merged, for example, by collapsing the two axes to one common axis, or by joining the two axes by a horizontal segment. For example, referring to FIG. 10, the portions of extended critical axes 133b and 133c between critical features 33b and 33c are separated by an orthogonal distance that is less than the minimum phase shape width $W_{min}$. Similarly, the portions of extended critical axes 131 and 132 between critical segments 31 and 32, and the portions of extended critical axes 136c and 137 between critical segments 36c and 37, are within the predetermined $W_{min}$. FIG. 11 shows the merging of the close pairs of critical axes identified in FIG. 10. The close portions of critical axes 131 and 132 are collapsed into one parallel axis portion, 138a, extending between critical segments 31 and 32, since axis 138a can maintain the same parallel orientation as the axes it replaces, and still contact the critical segments. On the other hand, since the other close pairs of axes are farther apart than the CD, but still within $W_{min}$, they are cut and joined by an intermediate axis portion perpendicular or orthogonal to the pair. Thus, axes 133c and 133b are merged by forming a connecting perpendicular segment 138b located at an intermediate distance between critical width segments 33b and 33c, and axes 136c and 137 are merged by forming a connecting perpendicular segment 138c located at an intermediate distance between critical width segments 36c and 37, so that each forms a continuous phase transition axis.

Figure 12:
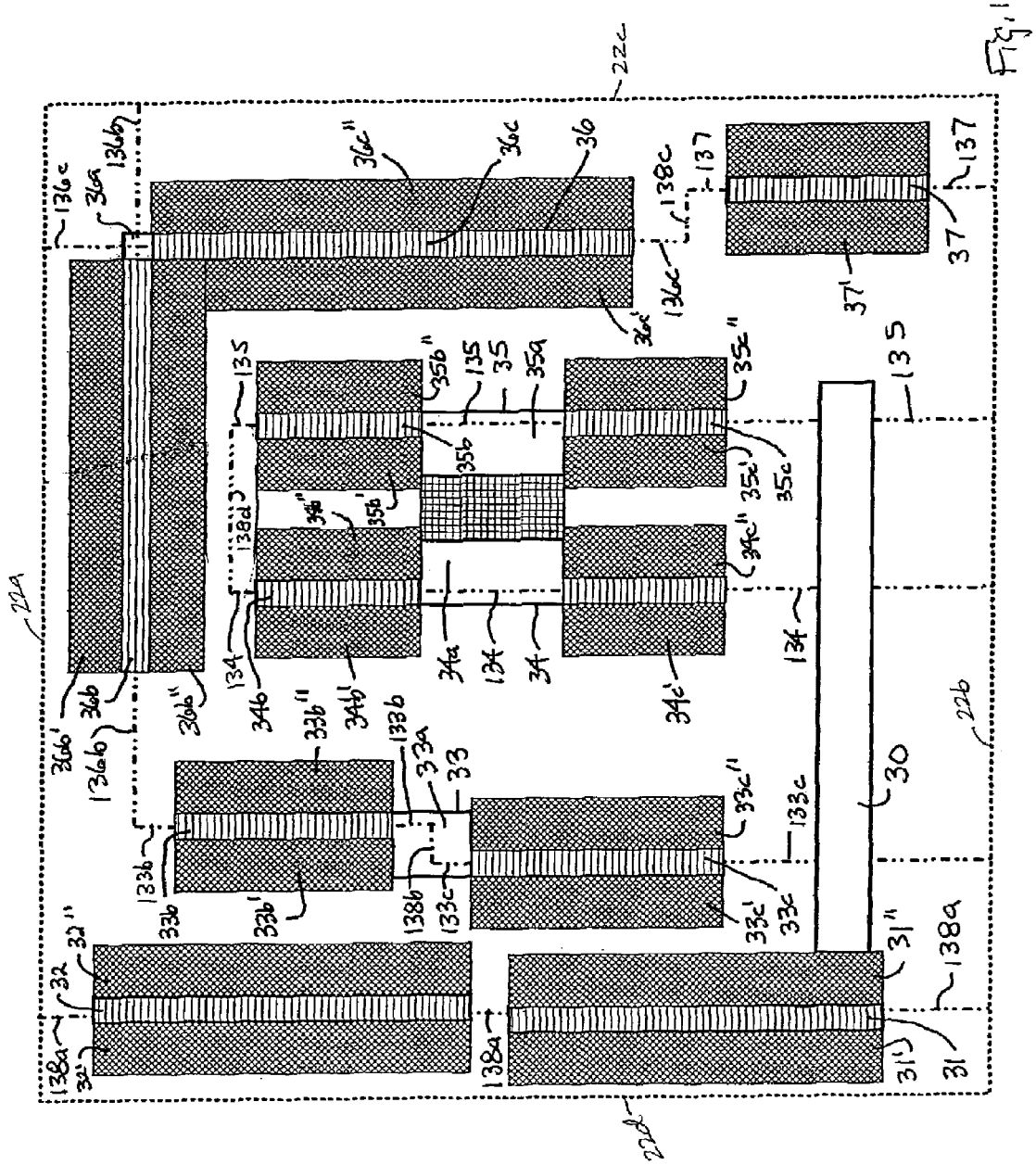
FIG. 12 is a plan view showing the elimination and merging of isolated critical axes of FIG. 8, and insertion of additional critical axes, within the phase universe boundaries of the integrated circuit design of FIG. 5.

Intersecting orthogonal axes are preferably terminated and joined at their intersection points to further reduce congestion. Preferably, isolated critical axes, i.e., those that do not reach the edge of the phase universe boundary, are merged with the first orthogonal axis they cross. For example, referring to FIG. 11, horizontal critical axis 136b extends leftward from the critical feature 36b and intersects with forbidden phase shifting shape 32" before it hits phase boundary 22d. Since this portion between critical feature 36b and phase shape 32" is isolated from the boundary, and crosses orthogonal vertical critical axis 133b, which extends upward from critical segment 33b, the two are terminated and joined at their point of intersection, as shown in FIG. 12. This eliminates the portions of these axes that extend beyond the intersection point toward the boundaries of phase universe 20. Also as shown in FIG. 11, the portions of critical axes 134 and 135 above critical width segments 34 and 35, respectively, are also isolated since they cross phase shifting shape 36b" before they hit boundary 22a. Accordingly, these axis portions are terminated and merged by inserting a connecting perpendicular axis portion 138d at an intermediate distance between critical width segments 34 and 35 and phase shifting shape 36b", as indicated in FIG. 12.

In general, any remaining open-ended axes are resolved by inserting supplemental axis into the freespaces until all extended and routed axes terminate at the edge of the phase universe. The resulting network of phase transition axes for the exemplary phase universe 20 is illustrated in FIG. 12. There may be cases where unresolveable phase conflicts are identified, for example, single open-ended axis in entirely enclosed freespace. Such cases are reported as layout conflicts and the design may need to be returned to a designer for correction.

Figure 13:
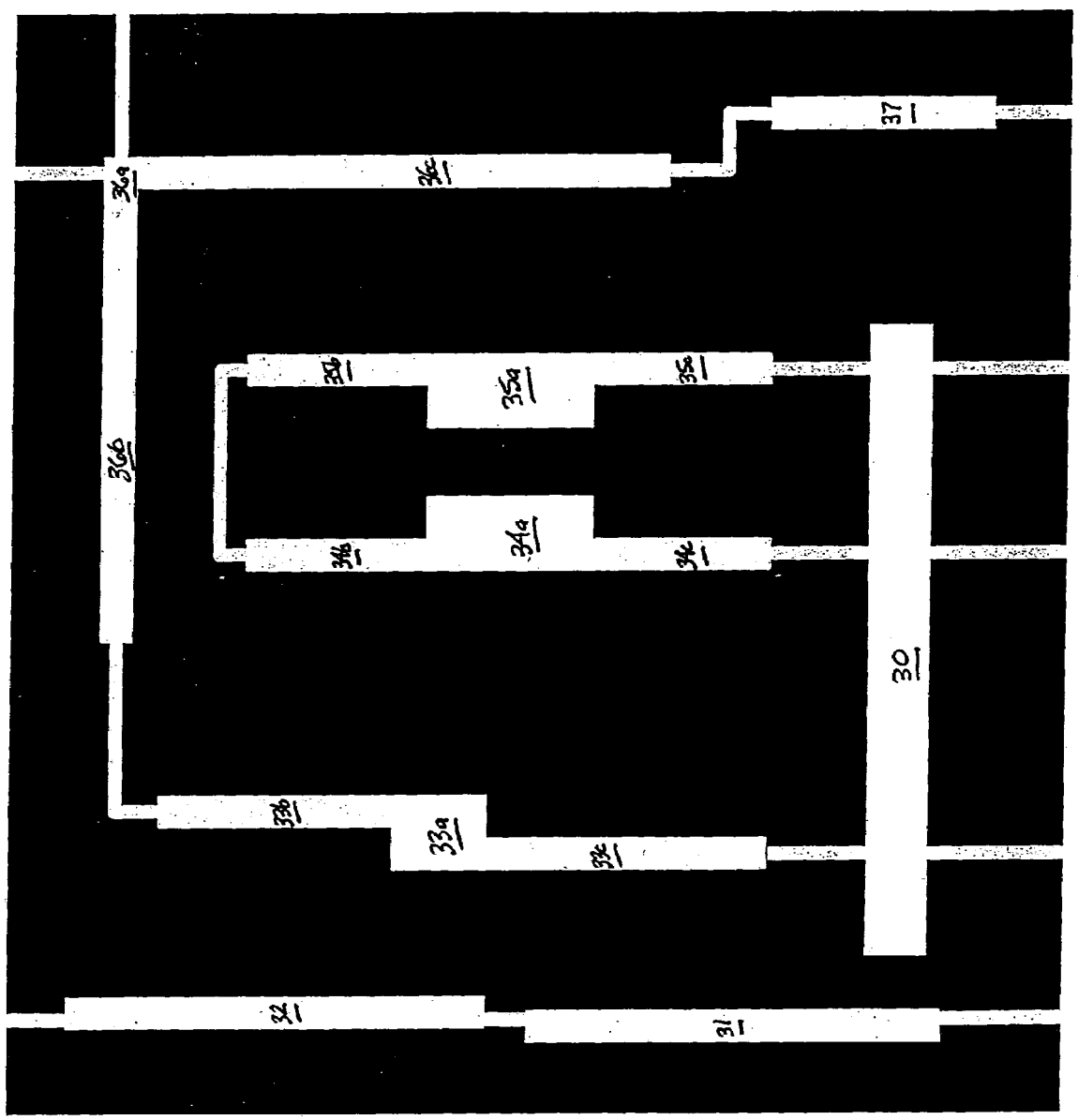
FIG. 13 is a plan view showing the subtraction of the original layout of FIG. 5 and the critical axes of FIG. 12 from the phase universe to provide a preliminary phase region layout.
Figure 14:
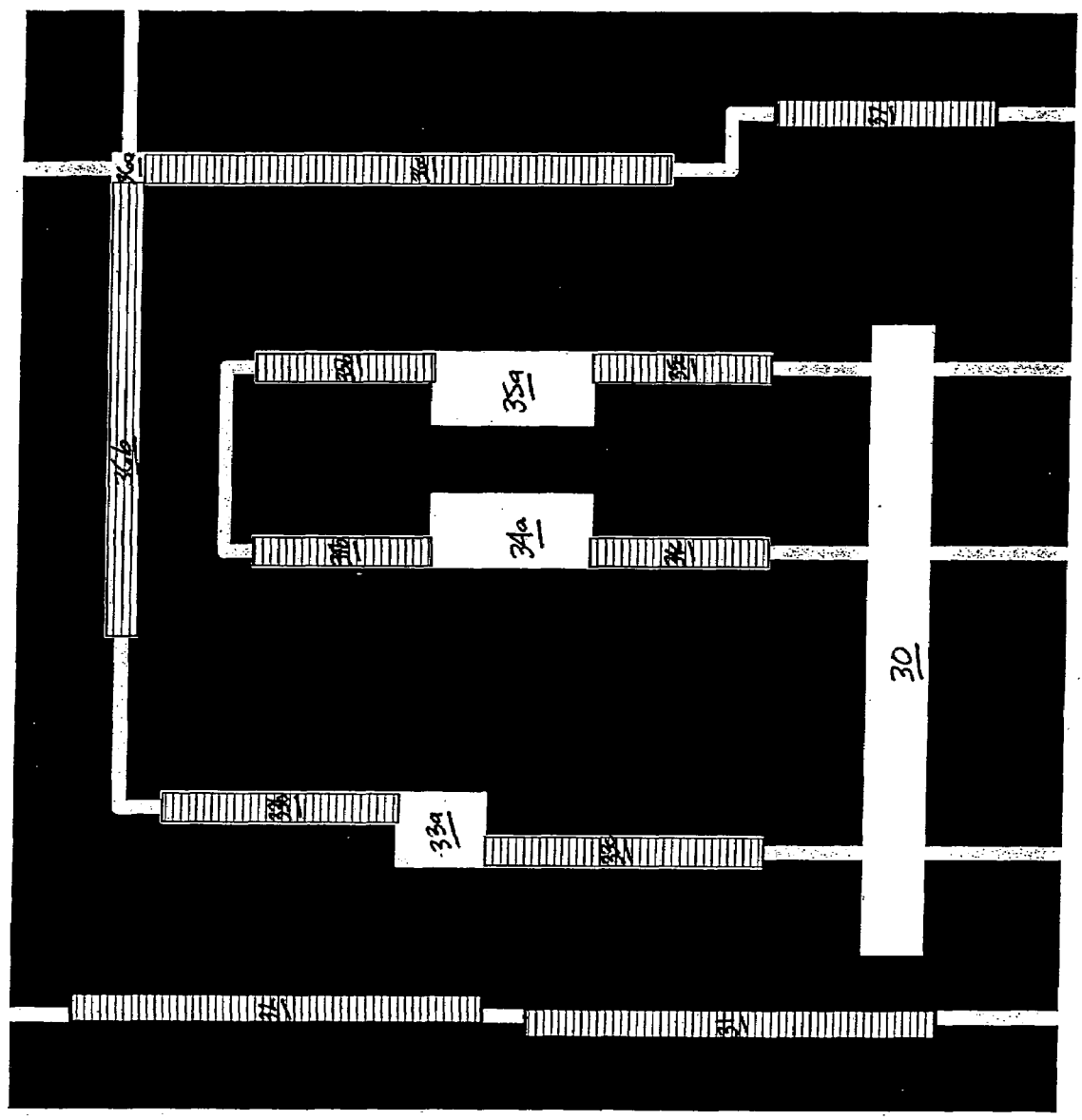
FIG. 14 is a plan view showing the insertion of the critical width features into the preliminary phase region layout of FIG. 13.

Subsequently, the phase layout in the resulting segmented phase universe 20 is then generated from the critical axis routing of FIG. 12 by dividing the phase universe into phase regions along the network of phase transition axes (step 212 of FIG. 18). This is done by subtracting the original layout and the merged, de-congested extended critical axes. As shown in FIG. 13, the light spaces identify the original integrated circuit layout (FIG. 5) as well as the remaining critical axes (FIG. 12), and the dark shapes identify the regions that are to be assigned opposing phases or colors. In FIG. 14, the original critical width portions are re-inserted so that the phase regions may be properly identified and assigned opposing phases.

Figure 15:
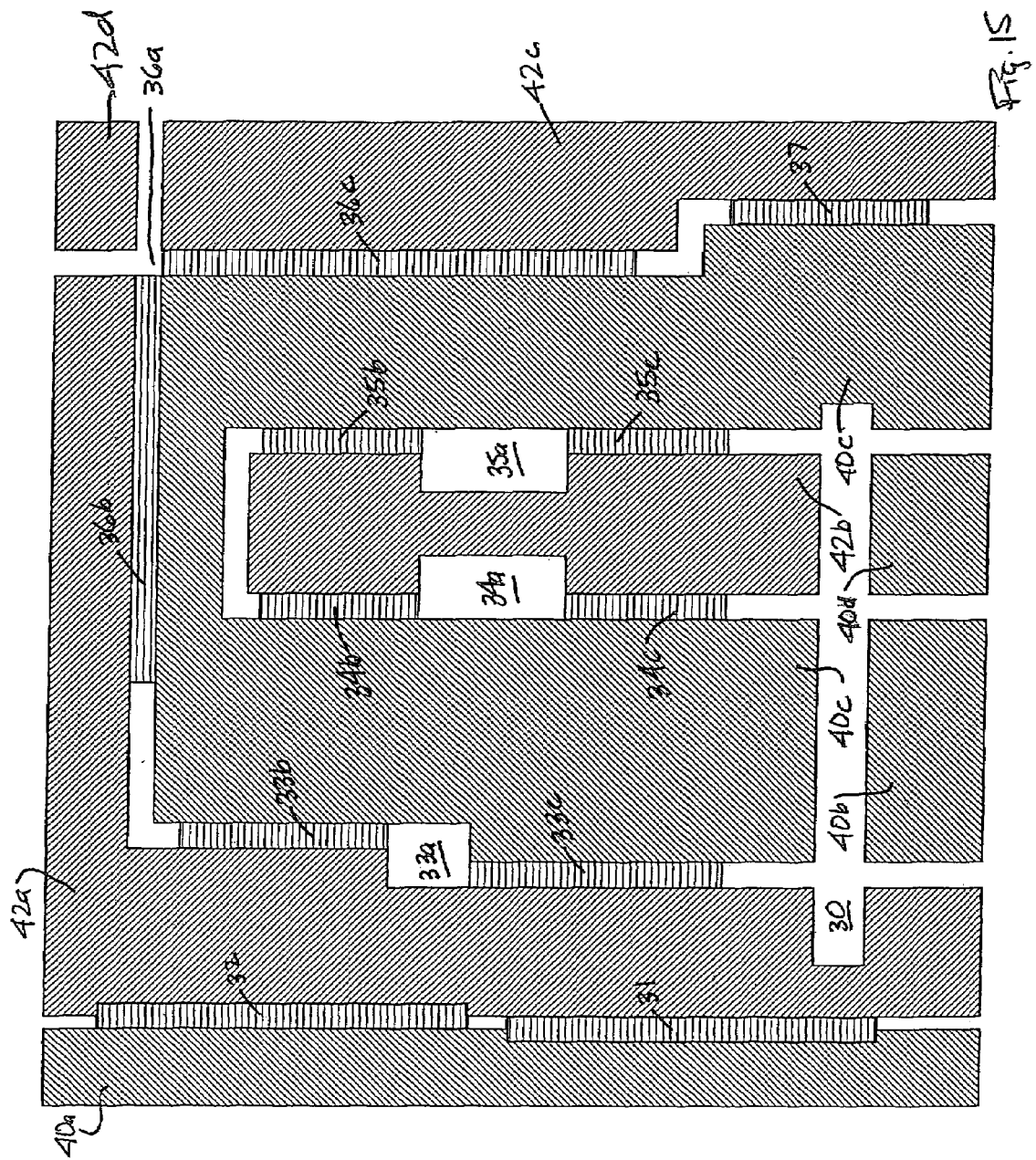
FIG. 15 is a plan view showing the assignment of phase regions into the preliminary phase region layout of FIG. 13.
Figure 16:
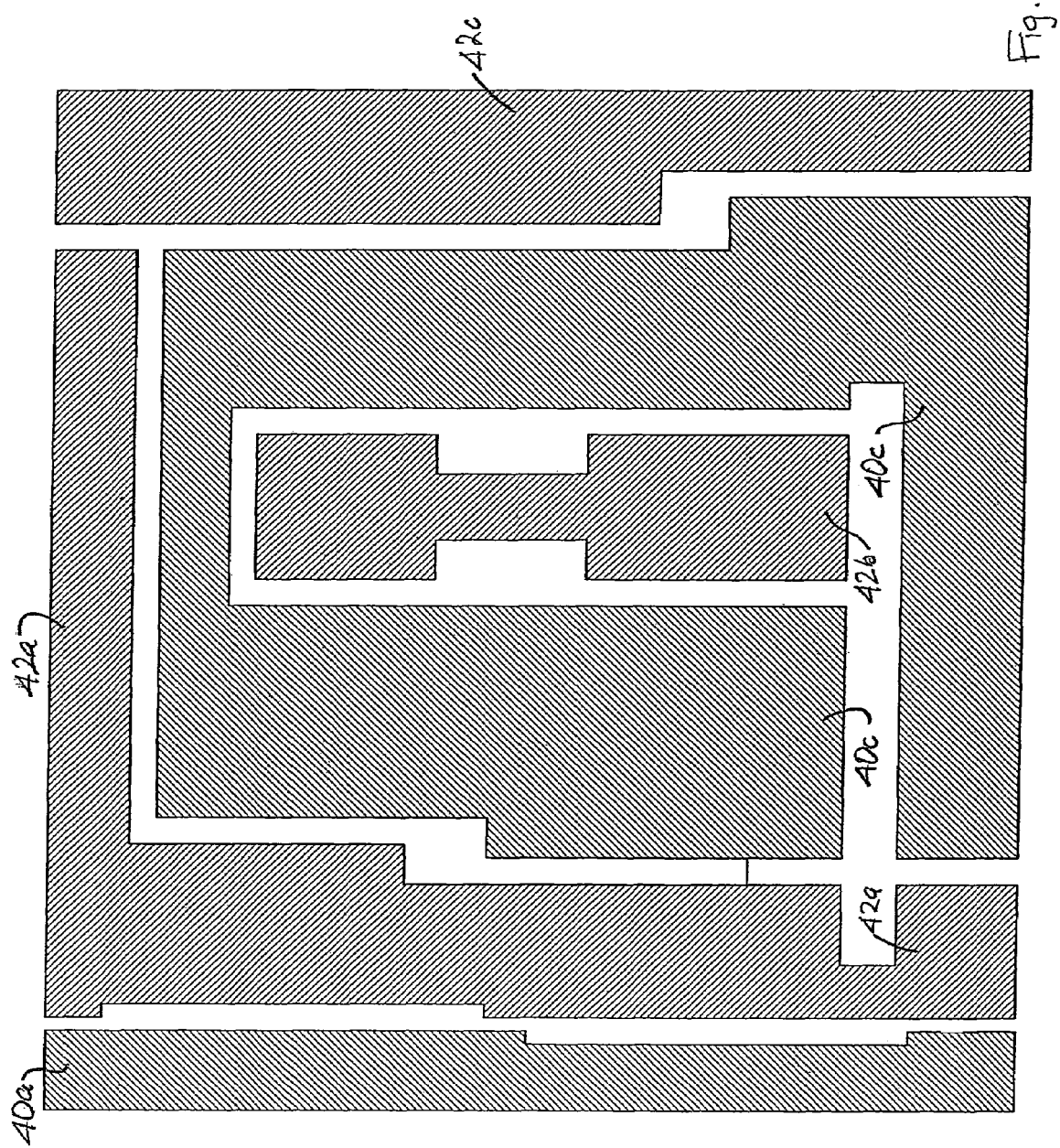
FIG. 16 is a plan view showing the merging of certain phase regions to provide the final phase region layout for the integrated circuit design of FIG. 5.

Phase shapes are then assigned to fill the freespaces between critical axes. Where a phase transition axis traverses freespace, a buffer space is provided on either side of the critical axis to conform to lithographic and manufacturability constraints, for example, by making the combined buffer zone thickness at least as wide as the minimum critical dimension of a primary feature. The phase shifting regions are then assigned binary phases, as illustrated in FIG. 15 (step 214 of FIG. 18), such that neighboring regions juxtaposed on opposite sides of each critical width feature are assigned opposite phases, e.g., 0° or 180°. In FIG. 15, the diagonal shading identifies the opposing phases, with shading lines extending from upper left to lower right signifying one phase 42a, 42b, 42c, 42d, and shading lines extending from upper right to lower left signifying the opposite phase 40a, 40b, 40c, 40d, 180° apart. Since phase regions 40b, 40d and 42d are not juxtaposed with a side of a critical width segment, they are assigned a default phase that is the same as an adjacent phase region. Subsequently, the phase regions of the same phase are merged where they are separated only by critical axes, and not by original layout primary features. This is shown in FIG. 16, with the original critical width portions removed, previous phase regions 40b and 40d merged into region 40c, and previous phase region 42d merged into phase region 42c. The phase shift mask for the original integrated circuit layout shown in FIG. 5 may then be made from the design of FIG. 16 by conventional methods.

Figure 17:
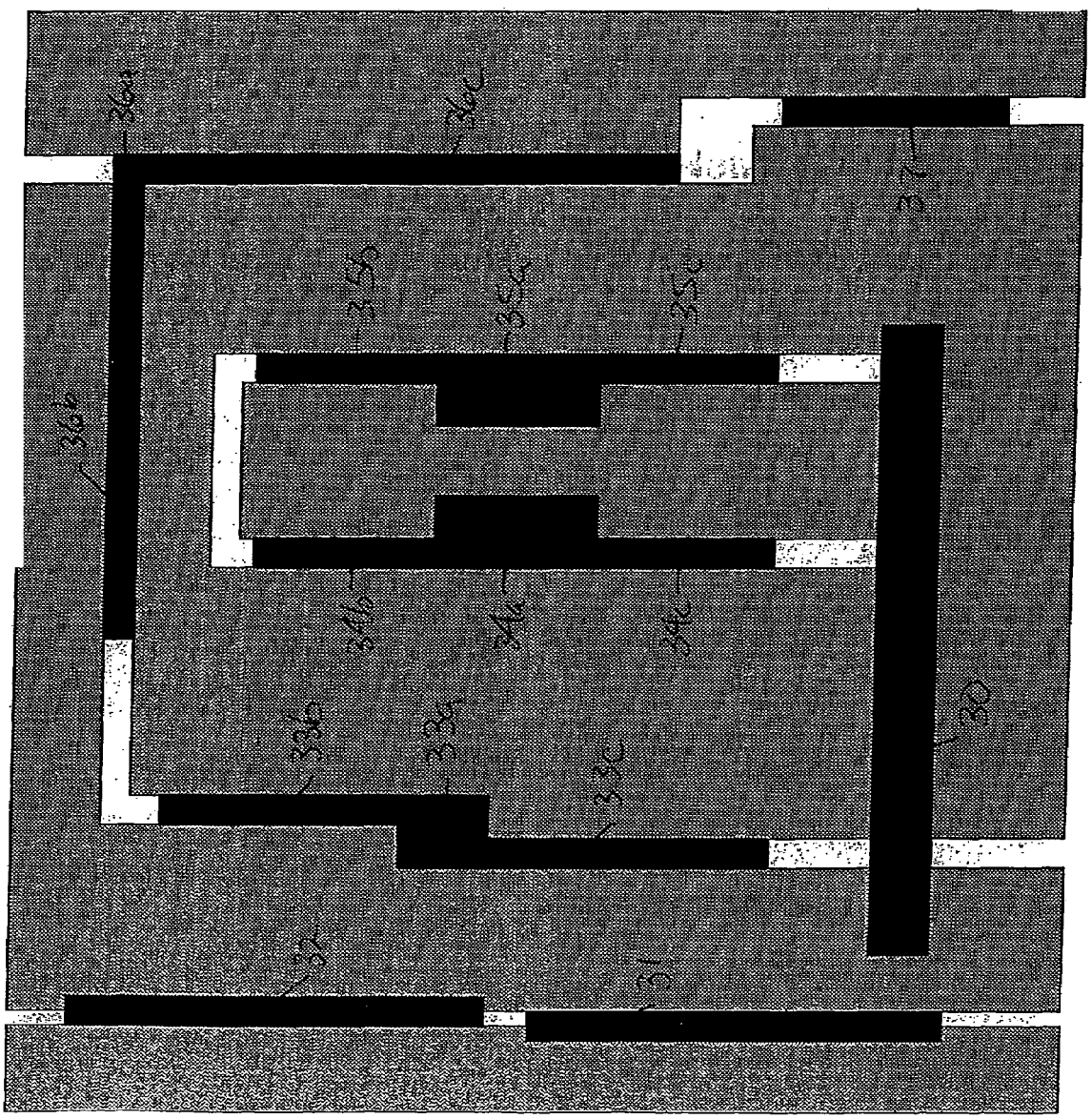
FIG. 17 illustrates block mask to be used in conjunction with the phase shifted mask layout of FIG. 16 to protect the desired patterns and erases all unwanted phase transitions.

FIG. 17 illustrates block mask to be used in conjunction with the phase shifted mask layout of FIG. 16. The block mask layout is derived (step 216 of FIG. 18) by identifying phase transition regions that need to be erased because they do not coincide with the original layout. The block mask therefore protects the desired patterns and erases all unwanted phase transitions.

Figure 19:
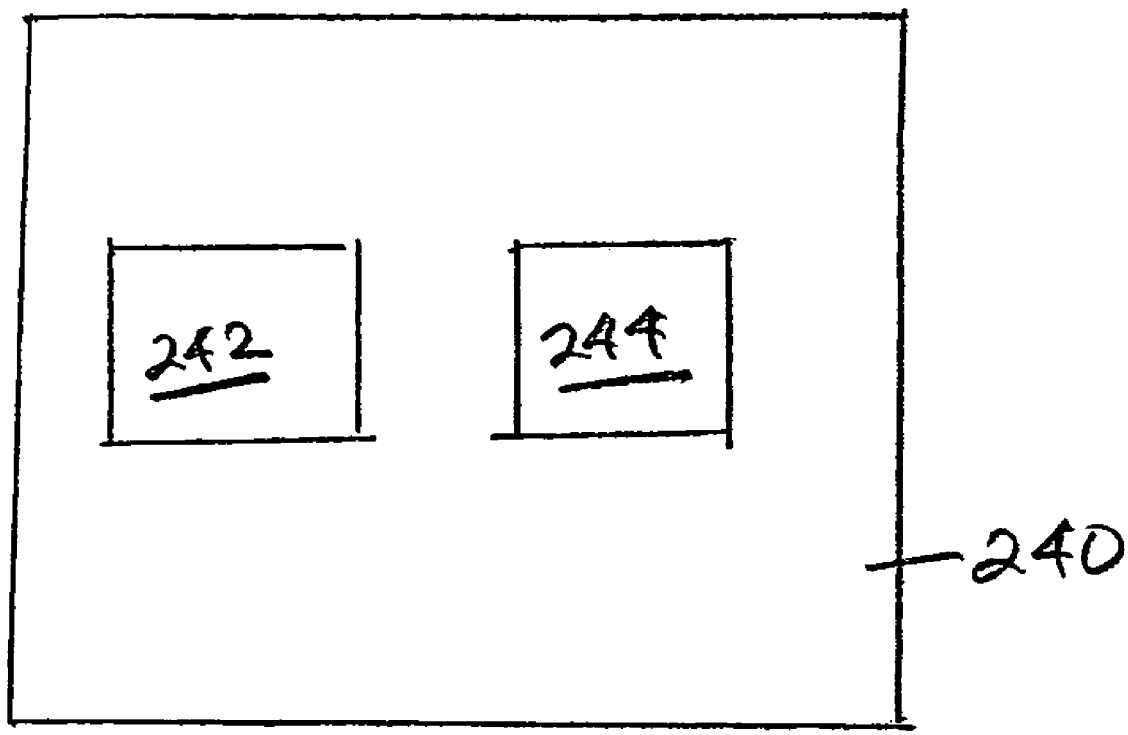
FIG. 19 is a schematic view of an EDA tool or computer containing program code in a program storage device for executing the method of designing an altPSM in accordance with the present invention.

The method of the present invention for designing an alternating phase shifting mask may be implemented by a computer program or software incorporating the process steps and instructions described above in otherwise conventional program code and stored on an electronic design automation (EDA) tool or an otherwise conventional program storage device. As shown in FIG. 19, the program code, as well as any input information required, may be stored in EDA tool or computer 240 on program storage device 242, such as a semiconductor chip, a read-only memory, magnetic media such as a diskette or computer hard drive, or optical media such as a CD or DVD ROM. Computer system 240 has a microprocessor 244 for reading and executing the stored program code in device 242 in the manner described above.

The present invention results in an optimized altPSM layout without iteration because the final altPSM layout is derived in a sequential series of steps based on the original layout of target design shapes. The altPSM layout generated by the inventive method is essentially correct-by-construction, and should be free from layout conflicts across all critical features within the phase universe. By contrast, in conventional iterative solutions, there is no guarantee that a solution will be found in the allotted number of iterations. Further, in the present invention the phase regions are bounded by the original layout of target primary features or largely straight lines, and phase width or spacing violations are avoided. The lithographic benefit of this approach is that the resulting altPSM layout approximates a uniform grating much better than conventional iterative design approaches, in which phase shapes are grown around critical layout regions. Additionally, since millions of shapes are operated on in a chip layout, eliminating the need to iterate the construction of each shape significantly speeds up the design process.

The inventive design approach is also different from earlier proposals on router-based altPSM design, since the inventive design approach carries a preferred orientation of the phase transitions through the entire layout segment or phase universe, thereby generating lithography friendly gratings. Stated a different way, according to the present invention, the phase transitions cut the background regions of the phase universe into predominantly slices that are substantially arranged as a one-dimensional grating, rather than forcing closed loops as a router would. This yields improved lithographic performance.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of designing an alternating phase shifting mask for projecting an image of an integrated circuit design comprising:
    providing a design of an integrated circuit layout having a plurality of spaced segments of critical dimension;
    identifying a phase universe boundary, the phase universe comprising a contiguous region of the integrated circuit layout wherein critical dimension segments within the phase universe are beyond a maximum phase interaction distance from any critical dimension segments outside the phase universe in accordance with predetermined design rules;
    dividing the phase universe into phase regions separated by the integrated circuit layout and any extensions of the critical dimension segments so that the phase regions are binary colorable within the phase universe.

2. The method of claim 1 further including:
    assigning phases to the phase regions; and
    creating an alternating phase shifting mask design based on the phases assigned to the phase regions.

3. The method of claim 1 further including forming extensions of the critical dimension segments along extensions of axes thereof, the extensions of the critical dimension segments having widths of at least a minimum spacing between phase regions.

4. The method of claim 3 wherein at least some of the extensions of the critical dimension segments terminate at the phase universe boundary.

5. The method of claim 1 wherein forbidden regions are defined by applying lithographic and manufacturability phase shift design rules and constraints around the critical segments, and further including defining a critical axis along a length of each of the critical dimension segments, routing the critical axes to avoid forbidden regions, and forming extensions of the critical dimension segments along the routed critical axes.

6. The method of claim 1 wherein regions outside the phase regions adjacent to the critical dimension segments comprise layout freespace; and further including selectively removing or merging portions of extended critical dimension segment axes within the layout freespace prior to dividing the phase universe.

7. The method of claim 3 wherein the phase universe boundary is substantially rectangular.

8. A method of designing an alternating phase shifting mask for projecting an image of an integrated circuit design comprising:
    providing a design of an integrated circuit layout having a plurality of segments of critical dimension, each critical dimension segment having an axis;
    extending the critical dimension segment axes beyond the critical dimension segments;
    identifying regions adjacent to the critical dimension segments to be occupied by phase shifting shapes of opposite phase to project the segments, with regions outside the identified regions adjacent to the critical dimension segments comprising layout freespace;
    selectively removing or merging portions of the extended critical dimension segment axes within the layout freespace;
    identifying major phase shifting regions outside of the integrated circuit layout and remaining extended critical dimension segment axes within the layout freespace;
    assigning phases to the identified major phase shifting regions; and
    creating an alternating phase shifting mask design based on the phases assigned to the identified major phase shifting regions.

9. The method of claim 8 further including creating a boundary around the integrated circuit layout, and wherein the layout freespace comprises regions outside the identified regions adjacent to the critical dimension segments and within the layout boundary.

10. The method of claim 9 further including extending the critical dimension segment axes to the layout boundary.

11. The method of claim 8 wherein the design of an integrated circuit layout further includes a plurality of segments of non-critical dimension.

12. The method of claim 11 wherein the layout freespace excludes space between segments of non-critical dimension that has a width less than a predetermined minimum phase shape width.

13. The method of claim 9 including selectively removing portions of the extended critical dimension segment axes within the layout freespace between the layout boundary and the regions adjacent to the critical dimension segments to be occupied by phase shifting shapes.

14. The method of claim 8 further including identifying portions of pairs of the extended critical dimension segment axes essentially parallel to each other and spaced within a predetermined minimum phase shape width, and replacing the pairs of the extended critical dimension segment axes with a single extended critical dimension segment axis intermediate the pair.

15. The method of claim 8 further including identifying portions of pairs of the extended critical dimension segment axes essentially parallel to each other and spaced within a predetermined minimum phase shape width, and joining the pairs of the extended critical dimension segment axes with an extended critical dimension segment axis perpendicular to the pair.

16. The method of claim 8 further including identifying portions of the extended critical dimension segment axes that intersect at a point between the layout boundary and either the critical dimension segments or the regions adjacent to the critical dimension segments to be occupied by phase shifting shapes, and removing such portions between the intersection point and the layout boundary.

17. The method of claim 8 wherein further including adding additional axes to join the extended critical dimension segment axes within the layout freespace.

18. The method of claim 8 further including identifying portions of the extended critical dimension segment axes that intersect with a region, adjacent to a critical dimension segment perpendicular thereto, to be occupied by a phase shifting shape; terminating such portions before they intersect; adding an additional axis perpendicular to the terminated portions of the extended critical dimension segment axes; and joining the terminated portions of the extended critical dimension segment axes with the additional perpendicular axis within the layout freespace.

19. The method of claim 8 wherein phases are assigned to the identified final phase shifting regions by assigning opposite phases to regions on opposite sides of the integrated circuit layout and remaining extended critical dimension segment axes within the layout freespace, assigning a default phase to any additional identified final phase shifting regions, and merging similar phases across any of the remaining extended critical dimension segment axes.

20. The method of claim 19 wherein similar phases are not merged across any of the integrated circuit layout.

21. The method of claim 19 wherein the design of an integrated circuit layout further includes a plurality of segments of non-critical dimension, and wherein similar phases are not merged across any of the integrated circuit layout.

22. An article of manufacture comprising a computer-usable medium having computer readable program code means embodied therein for designing an alternating phase shifting mask for projecting an image of an integrated circuit design, the layout having a plurality of spaced segments of critical dimension, the computer readable program code means in said article of manufacture comprising:
   computer readable program code means for identifying a phase universe boundary, the phase universe comprising a contiguous region of the integrated circuit layout wherein critical dimension segments within the phase universe are beyond a maximum phase interaction distance from any critical dimension segments outside the phase universe in accordance with predetermined design rules; and
   computer readable program code means for dividing the phase universe into phase regions separated by the integrated circuit layout and any extensions of the critical dimension segments so that the phase regions are binary colorable within the phase universe.

23. The article of manufacture of claim 22 further including computer readable program code means for assigning phases to the phase regions.

24. The article of manufacture of claim 22 further including computer readable program code means for forming extensions of the critical dimension segments along extensions of axes thereof, the extensions of the critical dimension segments having widths of at least a minimum spacing between phase regions.

25. The article of manufacture of claim 22 wherein forbidden regions are defined by applying lithographic and manufacturability phase shift design rules and constraints around the critical segments, and further including computer readable program code means for defining a critical axis along a length of each of the critical dimension segments, routing the critical axes to avoid forbidden regions, and forming extensions of the critical dimension segments along the routed critical axes.

26. The article of manufacture of claim 22 wherein regions outside the phase regions adjacent to the critical dimension segments comprise layout freespace, and further including computer readable program code means for selectively removing or merging portions of extended critical dimension segment axes within the layout freespace prior to dividing the phase universe.

27. A program storage device readable by a machine, tangibly embodying a program of instructions executable by the machine to perform method steps for designing an alternating phase shifting mask for projecting an image of an integrated circuit design, the layout having a plurality of spaced segments of critical dimension, said method steps comprising:
   identifying a phase universe boundary, the phase universe comprising a contiguous region of the integrated circuit layout wherein critical dimension segments within the phase universe are beyond a maximum phase interaction distance from any critical dimension segments outside the phase universe in accordance with predetermined design rules; and
   dividing the phase universe into phase regions separated by the integrated circuit layout and any extensions of the critical dimension segments so that the phase regions are binary colorable within the phase universe.

28. The program storage device of claim 27 wherein the method steps further include assigning phases to the phase regions.

29. The program storage device of claim 27 wherein the method steps further include forming extensions of the critical dimension segments along extensions of axes thereof, the extensions of the critical dimension segments having widths of at least a minimum spacing between phase regions.

30. The program storage device of claim 27 wherein forbidden regions are defined by applying lithographic and manufacturability phase shift design rules and constraints around the critical segments, and wherein the method steps further include defining a critical axis along a length of each of the critical dimension segments, routing the critical axes to avoid forbidden regions, and forming extensions of the critical dimension segments along the routed critical axes.

31. The program storage device of claim 27 wherein regions outside the phase regions adjacent to the critical dimension segments comprise layout freespace, and wherein the method steps further include selectively removing or merging portions of extended critical dimension segment axes within the layout freespace prior to dividing the phase universe.

* * * * *